(12) United States Patent
Aoyama

(10) Patent No.: US 8,071,969 B2
(45) Date of Patent: Dec. 6, 2011

(54) SEMICONDUCTOR MEMORY DEVICE AND METHOD FOR MANUFACTURING SAME

(75) Inventor: Kenji Aoyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 12/491,296

(22) Filed: Jun. 25, 2009

(65) Prior Publication Data

US 2010/0176488 A1 Jul. 15, 2010

(30) Foreign Application Priority Data

Jan. 9, 2009 (JP) ................................ 2009-003904

(51) Int. Cl.
*H01L 45/00* (2006.01)
*G11C 11/00* (2006.01)

(52) U.S. Cl. ............. 257/2; 257/4; 257/5; 257/E45.002; 365/148

(58) Field of Classification Search .................. 257/2, 4, 257/5, E45.002, E45.003; 365/148
See application file for complete search history.

(56) References Cited

U.S. PATENT DOCUMENTS

| 4,545,111 | A | 10/1985 | Johnson | |
|---|---|---|---|---|
| 2010/0108974 | A1* | 5/2010 | Park | 257/3 |
| 2010/0155784 | A1* | 6/2010 | Scheuerlein et al. | 257/209 |

FOREIGN PATENT DOCUMENTS

| JP | 2005-522045 | 7/2005 |
|---|---|---|
| KR | 1993-0000719 | 1/1993 |
| KR | 10-2004-0107487 | 12/2004 |
| WO | WO 03/085675 A2 | 10/2003 |

OTHER PUBLICATIONS

Korean Office Action, issued by Korean Patent Office dated Apr. 11, 2011, in a counterpart Korean patent application No. 10-2010-0001641 (4 pages), and English translation thereof English translation of JP 2005-522045.

* cited by examiner

*Primary Examiner* — Victor A Mandala
*Assistant Examiner* — Scott Stowe
(74) *Attorney, Agent, or Firm* — Finnegan, Henderson, Farabow, Garrett & Dunner, L.L.P.

(57) ABSTRACT

A semiconductor memory device includes a word line interconnect layer having a plurality of word lines extending in a word line direction and a bit line interconnect layer having a plurality of bit lines extending in a bit line direction alternately stacked on a silicon substrate. A variable resistance film is disposed between the word line and the bit line. A first pin diode extending in the word line direction is provided between the word line and the variable resistance film, and a second pin diode extending in the bit line direction is provided between the bit line and the variable resistance film. A region of an upper surface of the pin diode other than an immediately underlying region of the variable resistance film is located lower than the immediately underlying region.

12 Claims, 22 Drawing Sheets

VERTICAL DIRECTION
WORD LINE DIRECTION
BIT LINE DIRECTION

SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-003904, filed on Jan. 9, 2009; the entire contents of which are incorporated herein by reference.

BACKGROUND OF THE INVENTION

1. Field of the Invention

This invention relates to a semiconductor memory device including a variable resistance film and a method for manufacturing the same.

2. Background Art

Various nonvolatile memories including flash memory, MRAM (Magneto resistive Random Access Memory), and FeRAM (Ferroelectric Random Access Memory) are developed to realize nonvolatile memories with high speed and high capacity. In this context, it has recently been discovered that a specific metal oxide material upon application of voltage exhibits two states, i.e., a low-resistance state and a high-resistance state, depending on the state and the voltage at the time. This phenomenon is used to propose the idea of a new nonvolatile memory, ReRAM (Resistance Random Access Memory), which is drawing attention.

As a device structure for actually commercializing ReRAM, in order to increase the level of integration of memory cells, a three-dimensional cross-point structure is proposed, in which interconnect layers each including a plurality of word lines parallel to each other and interconnect layers each including a plurality of bit lines parallel to each other are alternately stacked on a peripheral circuit for operating memory cells, each being connected between one word line and one bit line (see, e.g., JP-T-2005-522045).

In the ReRAM of the three-dimensional cross-point structure, by selecting one word line and one bit line to selectively apply a voltage to one memory cell connected therebetween, the resistance state of a variable resistance element provided in the memory cell is controlled to program data. By applying a prescribed voltage to each memory cell and measuring the amount of current flowing therethrough, the resistance state of the variable resistance element is detected to read the programmed data.

In this case, in the program operation, for example, by applying a potential of +5 V to one selected bit line and a potential of 0 V to one selected word line, a voltage of +5 V is applied to the memory cell connected therebetween. Here, to avoid applying voltage to the memory cell between the selected bit line and a non-selected word line and the memory cell between the selected word line and a non-selected bit line, a potential of 0 V is applied to non-selected bit lines like the selected word line, and a potential of +5 V is applied to non-selected word lines like the selected bit line. However, this unfortunately results in applying a voltage of −5 V to the memory cell connected between a non-selected bit line and a non-selected word line.

To solve this problem, each memory cell is provided with a diode having the forward direction from the bit line to the word line. Thus, in the selected memory cell, a forward voltage is applied to the diode, and a voltage is applied to the variable resistance element. In contrast, in a non-selected memory cell connected between a non-selected word line and a non-selected bit line, a reverse voltage is applied to the diode, and no voltage is applied to the variable resistance element.

However, by providing the diode in the memory cell, the low forward current through the diode results in a small difference in the amount of current flowing in the high-resistance state of the variable resistance element and the amount of current flowing in the low-resistance state thereof, which causes the problem of narrowing the margin of read operation.

SUMMARY OF THE INVENTION

According to an aspect of the invention, there is provided a semiconductor memory device including: a substrate; a first interconnect layer having a plurality of first potential supply lines extending in a first direction; a second interconnect layer having a plurality of second potential supply lines extending in a second direction crossing the first direction; a variable resistance film located between the first potential supply line and the second potential supply line; and a diode located between the variable resistance film and one of the first potential supply line and the second potential supply line sandwiching the variable resistance film, the one potential supply line being located nearer to the substrate, the diode extending along the potential supply line located nearer to the substrate and passing a current in a direction from the first potential supply line to the second potential supply line, the first interconnect layer and the second interconnect layer being alternately stacked on the substrate, and a region of an upper surface of the diode other than an immediately underlying region of the variable resistance film being located lower than the immediately underlying region.

According to another aspect of the invention, there is provided a method for manufacturing a semiconductor memory device, including: forming a first conductive film on a substrate; forming a first diode on the first conductive film, the first diode being configured to pass a current downward; dividing the first conductive film and the first diode along a first direction; forming a first variable resistance film on the first diode; dividing an upper portion of the first diode and the first variable resistance film along both the first direction and a second direction crossing the first direction; forming a second conductive film on the first variable resistance film; forming a second diode on the second conductive film, the second diode being configured to pass a current upward; dividing the second conductive film and the second diode along the second direction; forming a second variable resistance film on the second diode; and dividing an upper portion of the second diode and the second variable resistance film along both the first direction and the second direction.

According to still another aspect of the invention, there is provided a method for manufacturing a semiconductor memory device, including: forming a first conductive film on a substrate; forming a first diode on the first conductive film, the first diode being configured to pass a current downward; forming a first variable resistance film on the first diode; dividing the first conductive film, the first diode, and the first variable resistance film along a first direction; forming a second conductive film on the first variable resistance film; forming a second diode on the second conductive film, the second diode being configured to pass a current upward; forming a second variable resistance film on the second diode; and dividing an upper portion of the first diode, the first variable resistance film, the second conductive film, the second diode, and the second variable resistance film along a second direction crossing the first direction.

DETAILED DESCRIPTION OF THE INVENTION

Embodiments of the invention will now be described with reference to the drawings.

At the outset, a first embodiment of the invention is described.

The semiconductor memory device according to this embodiment is a resistance random access memory (ReRAM).

Figure 1:
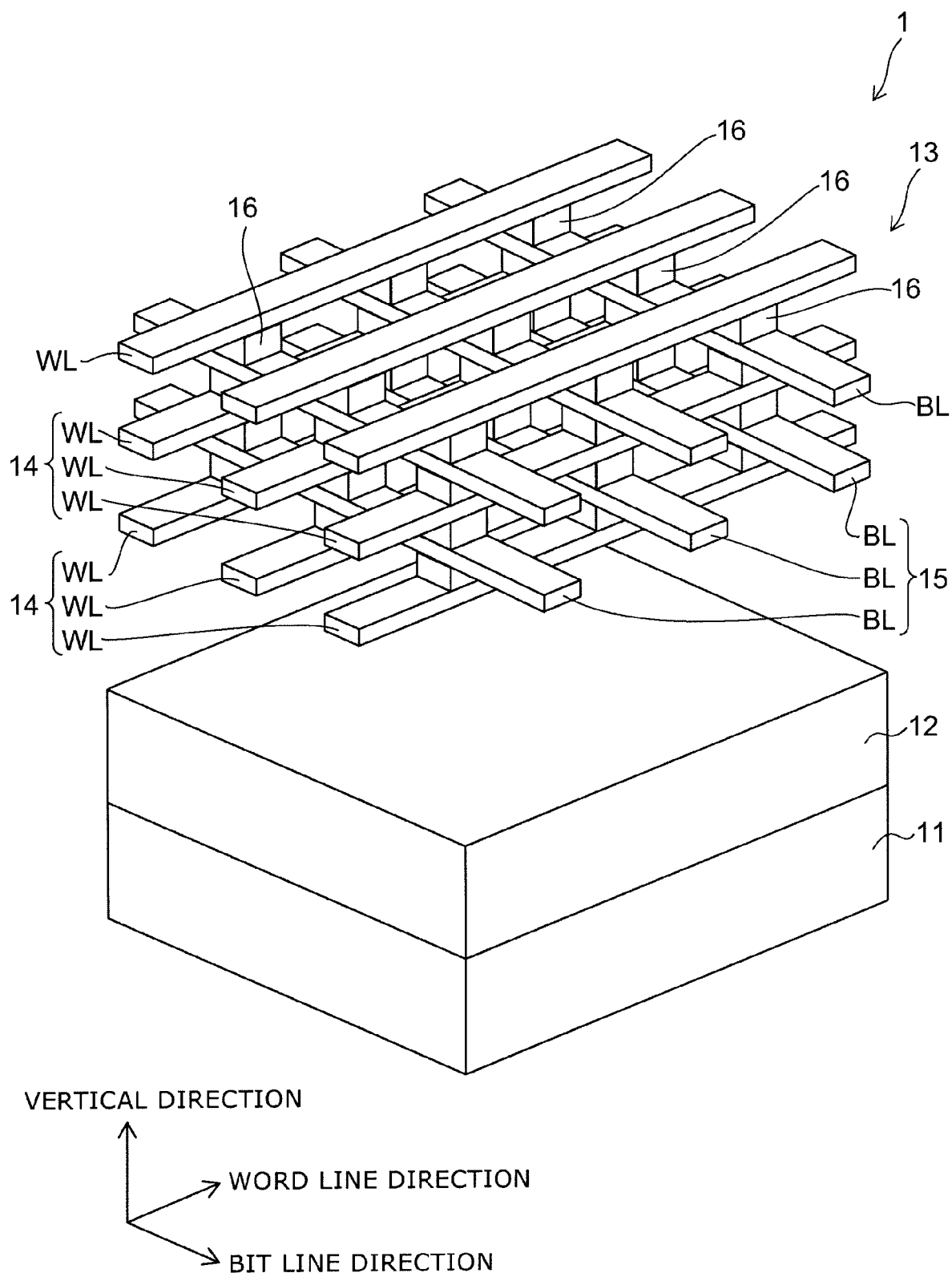
FIG. 1 is a perspective view illustrating a semiconductor memory device according to a first embodiment of the invention.

FIG. 1 is a perspective view illustrating a semiconductor memory device according to this embodiment.

Figure 2:
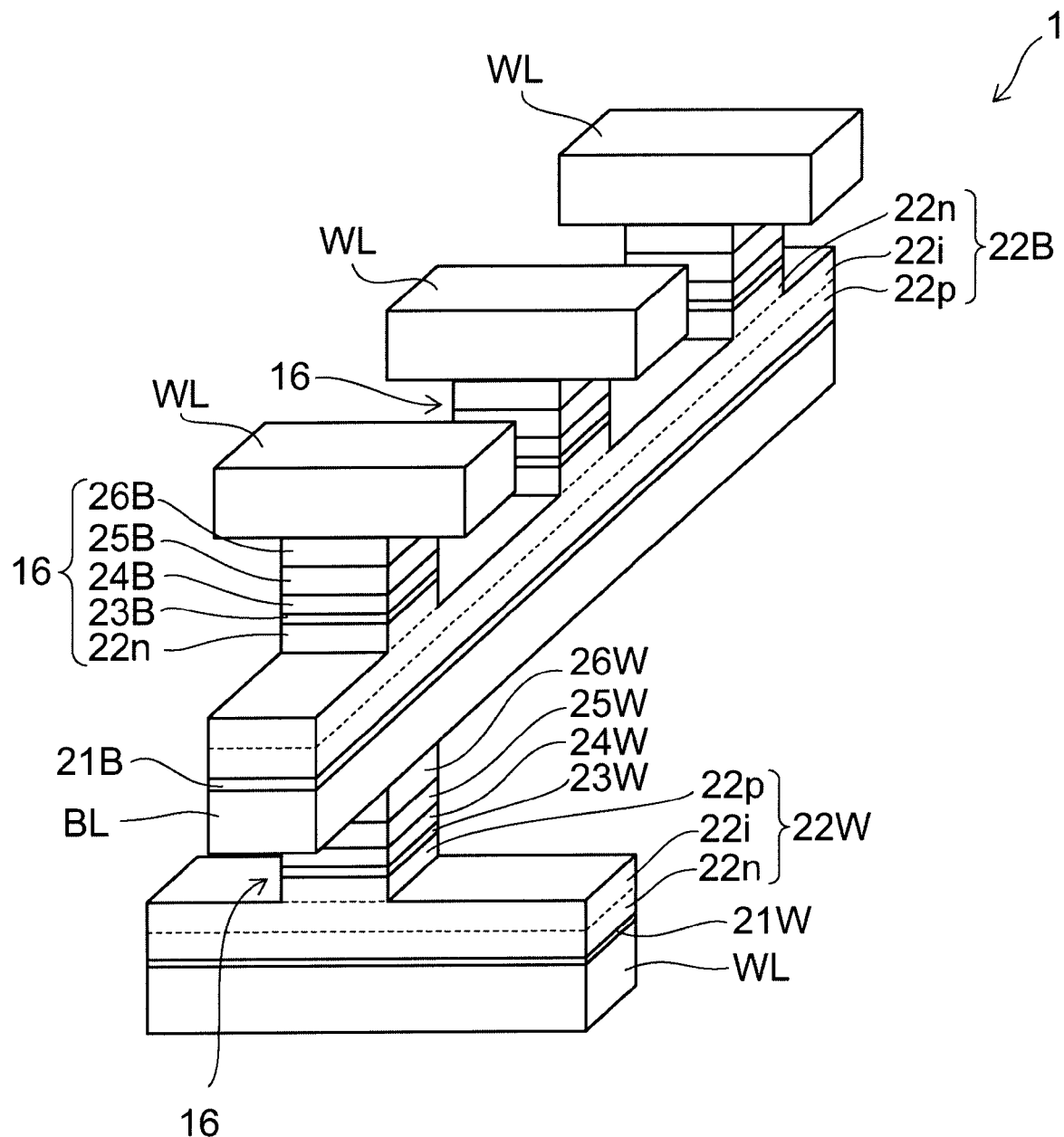
FIG. 2 is a perspective view illustrating a part of the semiconductor memory device shown in FIG. 1.

FIG. 2 is a perspective view illustrating a part of the semiconductor memory device shown in FIG. 1.

Figure 3:
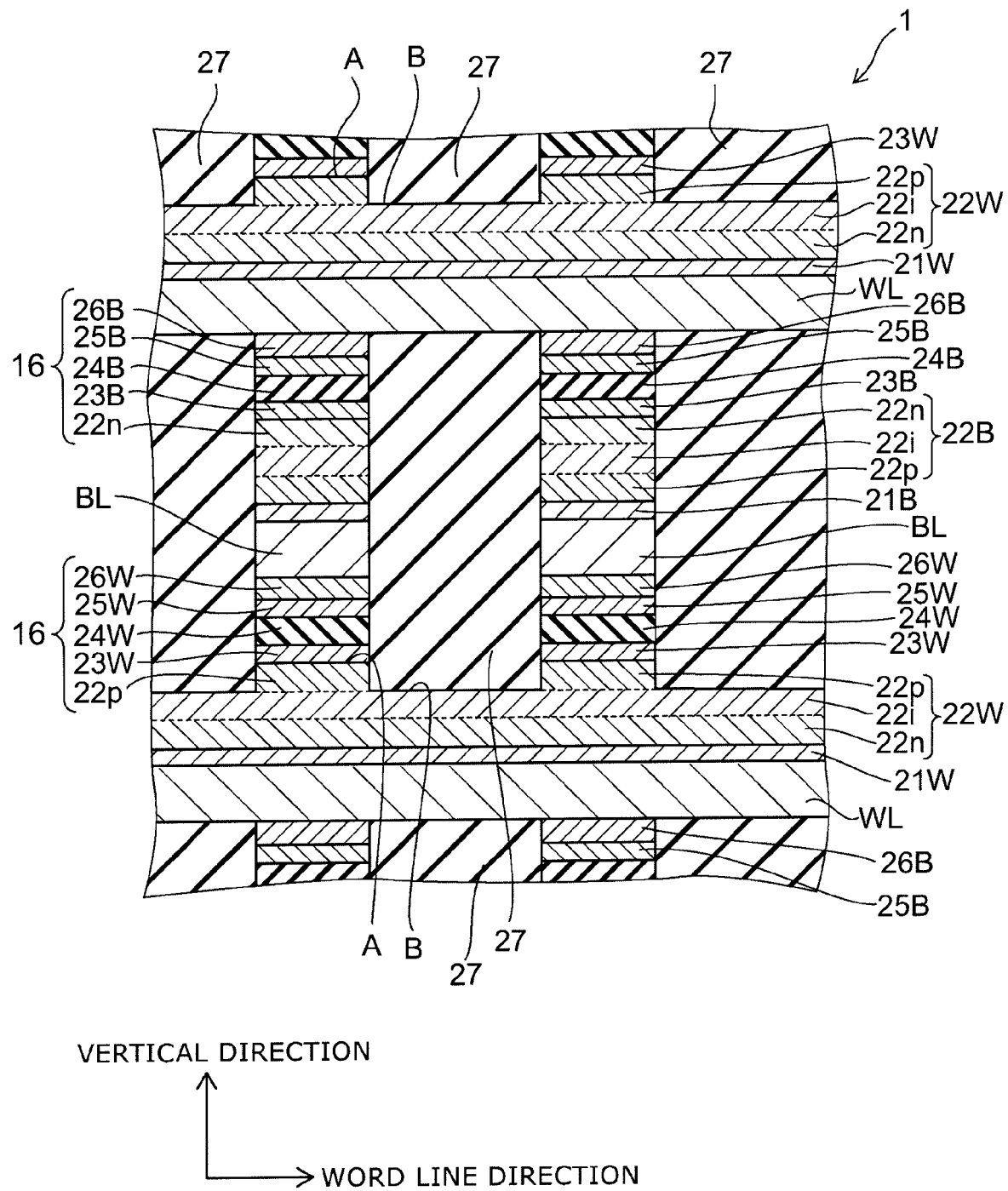
FIG. 3 is a cross-sectional view illustrating a part of the semiconductor memory device shown in FIG. 1.

FIG. 3 is a cross-sectional view illustrating a part of the semiconductor memory device shown in FIG. 1.

Figure 4:
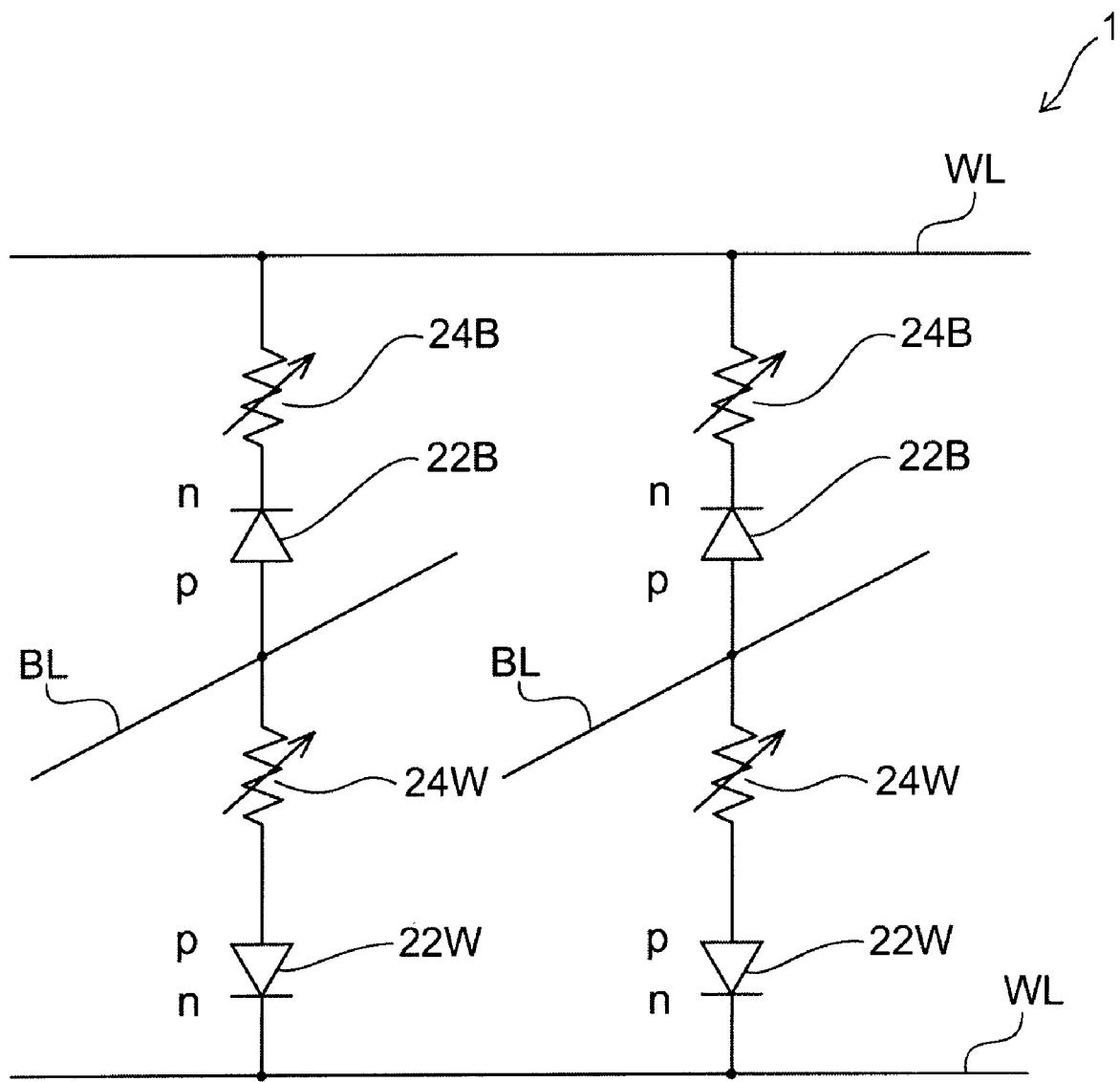
FIG. 4 is a circuit diagram corresponding to FIG. 3.

FIG. 4 is a circuit diagram corresponding to FIG. 3.

As shown in FIG. 1, the semiconductor memory device 1 according to this embodiment includes a silicon substrate 11. A driving circuit (not shown) for the semiconductor memory device 1 is formed in the upper portion and on the upper surface of the silicon substrate 11. An interlayer dielectric film 12 illustratively made of silicon oxide is provided on the silicon substrate 11 so as to bury the driving circuit, and a memory cell section 13 is provided on the interlayer dielectric film 12.

In the memory cell section 13, word line interconnect layers 14 each including a plurality of word lines WL extending in a direction (hereinafter referred to as "word line direction") parallel to the upper surface of the silicon substrate 11, and bit line interconnect layers 15 each including a plurality of bit lines BL extending in a direction (hereinafter referred to as "bit line direction") being parallel to the upper surface of the silicon substrate 11 and crossing, such as being orthogonal to, the word line direction, are alternately stacked via a dielectric layer. The word line WL and the bit line BL are formed from conductor, such as metal. The adjacent word lines WL, the adjacent bit lines BL, and the word line WL and the bit line BL are not in contact with each other. A pillar 16 extending in the direction (hereinafter referred to as "vertical direction") perpendicular to the upper surface of the silicon substrate 11 is provided at a portion where each word line WL and each bit line BL are located nearest.

As shown in FIGS. 2 and 3, a lower electrode film 21W is provided immediately above each word line WL, and a pin diode 22W is provided thereon. The pin diode 22W is shaped like a line extending in the word line direction along the word line WL immediately therebelow. The pin diode 22W is illustratively formed from polysilicon and includes an n-type layer 22n, an i-type layer 22i, and a p-type layer 22p stacked in this order from bottom. On the pin diode 22W, an intermediate electrode film 23W, a variable resistance film (ReRAM film) 24W, an upper electrode film 25W, and a stopper film 26W are provided in this order, and the stopper film 26W is connected to a bit line BL located thereabove. That is, between a word line WL and a bit line BL located immediately thereabove, the lower electrode film 21W, the pin diode 22W, the intermediate electrode film 23W, the variable resistance film 24W, the upper electrode film 25W, and the stopper film 26W are arranged in series in this order from bottom to top.

A lower electrode film 21B is provided immediately above each bit line BL, and a pin diode 22B is provided thereon. The pin diode 22B is shaped like a line extending in the bit line direction along the bit line BL immediately therebelow. The pin diode 22B is also illustratively formed from polysilicon and includes a p-type layer 22p, an i-type layer 22i, and an n-type layer 22n stacked in this order from bottom. On the pin diode 22B, an intermediate electrode film 23B, a variable resistance film 24B, an upper electrode film 25B, and a stopper film 26B are provided in this order, and the stopper film 26B is connected to a word line WL located thereabove. That is, between a bit line BL and a word line WL located immediately thereabove, the lower electrode film 21B, the pin diode 22B, the intermediate electrode film 23B, the variable resistance film 24B, the upper electrode film 25B, and the stopper film 26B are arranged in series in this order from bottom to top.

Thus, as shown in FIG. 4, the pin diode 22W and 22B (hereinafter also collectively referred to as "pin diode 22", the same also applying to other components) are connected in a direction such that they can pass a current in the direction from the bit line BL to the word line WL, but do not pass a current in the direction from the word line WL to the bit line BL. The pin diode 22 is located below, that is, on the silicon substrate 11 side of, the variable resistance film 24 belonging to the same pillar 16.

The lower electrode film 21, the intermediate electrode film 23, and the upper electrode film 25 are formed from metal, and the stopper film 26 is formed from harder metal, such as tungsten (W).

The variable resistance film 24 is illustratively formed from metal oxide, such as composite compound containing at least two cationic elements. At least one of the cationic elements is a transition element with the d orbitals incompletely filled with electrons, and the shortest distance between adjacent cationic elements is 0.32 nm or less. Specifically, the variable resistance film 24 is made of material expressed by the chemical formula $A_xM_yX_z$, where A and M are different elements each other, including materials having crystal structures such as the spinel structure ($AM_2O_4$), ilmenite structure ($AMO_3$), delafossite structure ($AMO_2$), $LiMoN_2$ structure ($AMN_2$), wolframite structure ($AMO_4$), olivine structure ($A_2MO_4$), hollandite structure ($A_xMO_2$), ramsdellite structure ($A_xMO_4$), and perovskite structure ($AMO_3$). By way of example, A is zinc (Zn), M is manganese (Mn), and X is oxygen (O). Alternatively, the variable resistance film 24 is a dielectric film containing at least one metal selected from aluminum (Al), titanium (Ti), manganese (Mn), nickel (Ni), cobalt (Co), zirconium (Zr), niobium (Nb), hafnium (Hf), tantalum (Ta), and tungsten (W).

Figure 8:
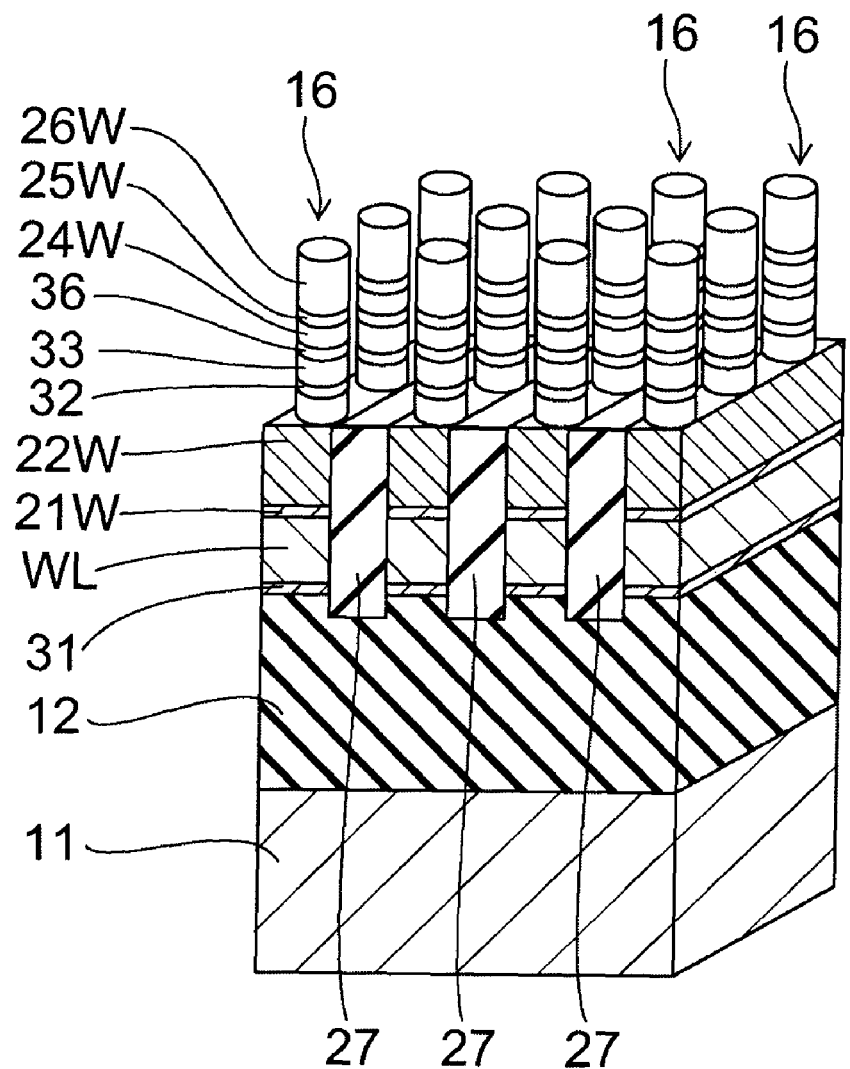
Figure 9:
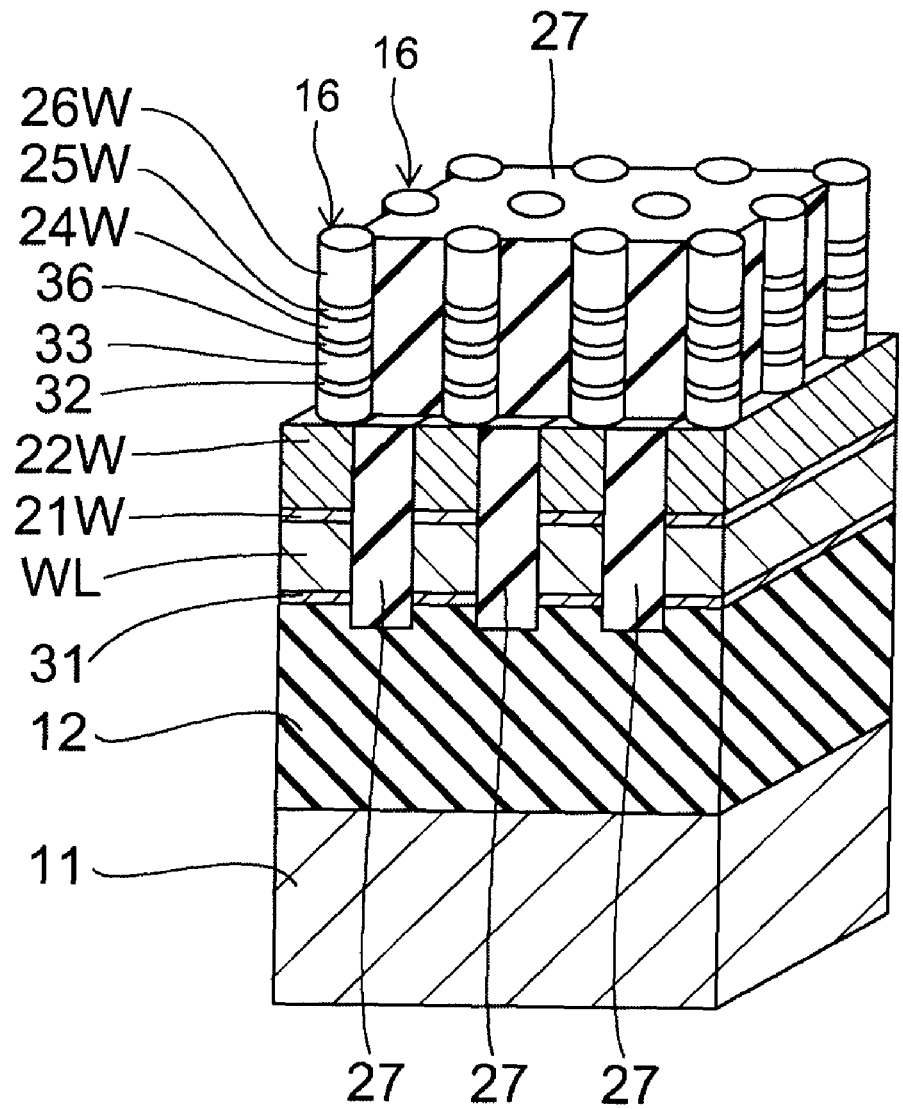
Figure 9:
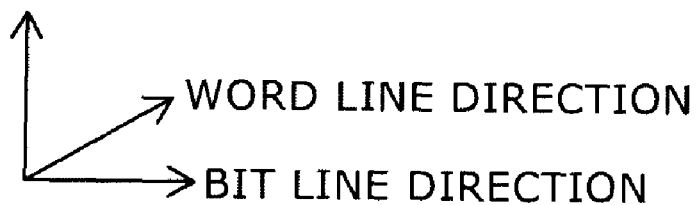
Figure 10:
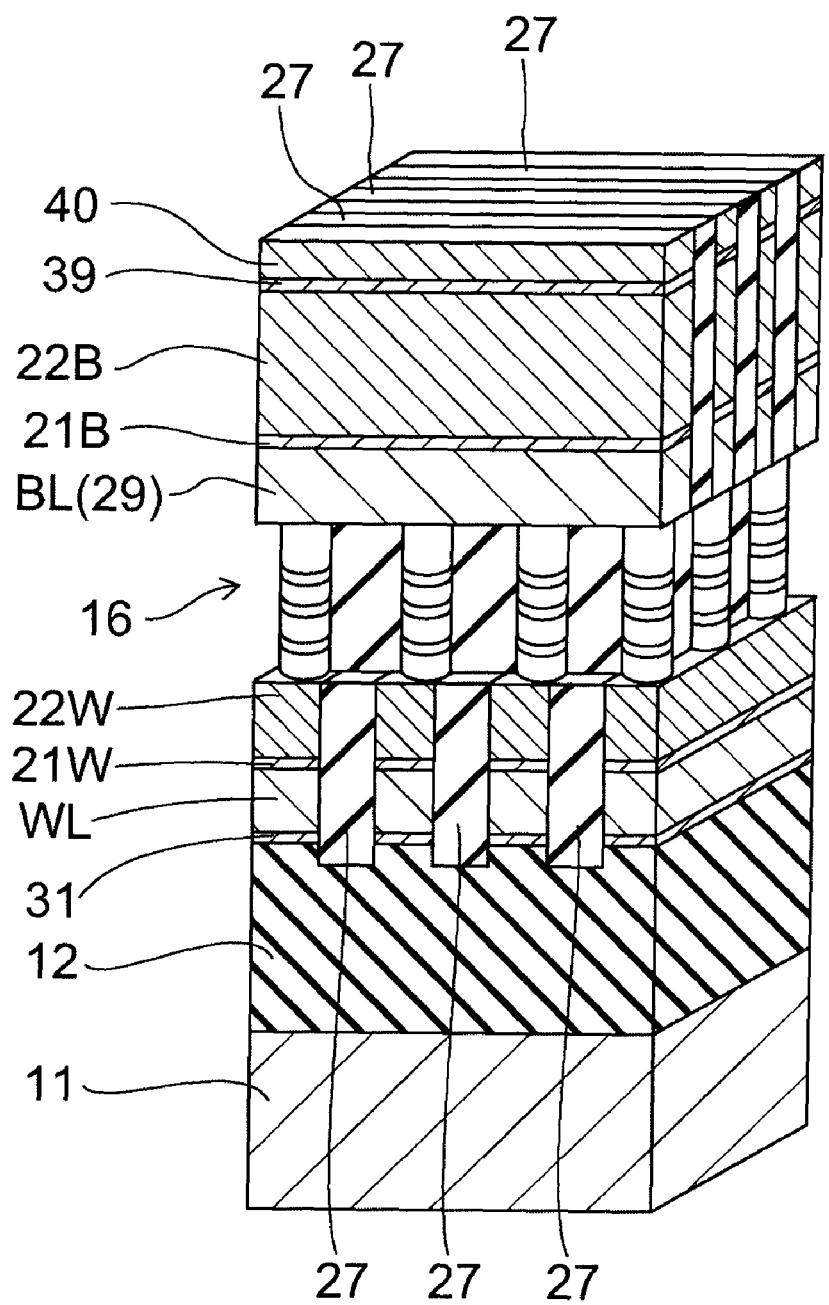
Figure 10:
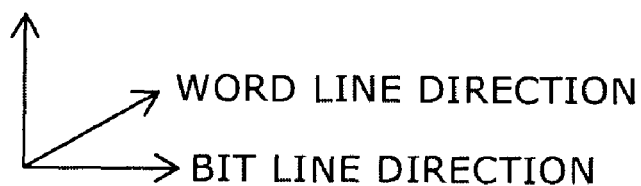

The upper portion of the pin diode 22, and the intermediate electrode film 23, the variable resistance film 24, the upper electrode film 25, and the stopper film 26 stacked thereon are patterned into a vertically extending column to constitute a pillar 16. In the example shown in FIGS. 1 to 3, the pillar 16 is shaped like a quadrangular prism, but this embodiment is not limited thereto. For example, it may be shaped like a cylinder as shown in FIGS. 8 to 10 described later.

On the other hand, the lower portion of the pin diode 22W extends in the word line direction along the word line WL immediately therebelow, and is continuously disposed so as to connect the immediately underlying regions of a plurality of pillars 16. Likewise, the lower portion of the pin diode 22B extends in the bit line direction along the bit line BL immediately therebelow, and is continuously disposed so as to connect the immediately underlying regions of a plurality of pillars 16. Hence, the region B in the upper surface of the pin diodes 22W and 22B other than the region A immediately below the variable resistance film 24 is located lower than the region A immediately below the variable resistance film 24.

The thickness of each layer of the pin diode 22 is illustratively larger than 35 nm, and the total thickness of the pin diode 22 is illustratively 200 nm. Preferably, the vertical position of the region B is lower than the interface between the uppermost layer and the second uppermost layer of the plurality of layers having different electrical properties constituting the pin diode 22, that is, of the p-type layer 22$p$, the i-type layer 22$i$, and the n-type layer 22$n$, and higher than the position 35 nm below this interface. That is, with regard to the pin diode 22W, the position of the region B is preferably in the range from the position of the interface of the p-type layer 22$p$, which is the uppermost layer, and the i-type layer 22$i$, which is the second uppermost layer, to the position 35 nm below this interface. The reason for this is described later.

In the pin diode, the n-type layer and the p-type layer are different from the i-type layer in effective dopant concentration. If the number of dopants per memory cell is less than one on average, this portion can be said to have i-type conductivity. Thus, in the pin diode, the interface between the n-type layer and the i-type layer or the interface between the p-type layer and the i-type layer can be identified by obtaining a dopant concentration profile along the vertical direction and specifying the position where the dopant concentration is such that the number of dopants per memory cell is one on average. Specifically, for example, a relatively large region having an area of approximately several hundred $\mu m^2$ is analyzed using secondary ion mass spectrometry (SIMS) to obtain a dopant concentration profile in the vertical direction of the pin diode. For a memory cell approximately several ten nm square, the dopant concentration such that the number of dopants per memory cell is one on average is approximately $10 \times 10^{17}$ cm$^{-3}$. Hence, the position in the aforementioned profile where the dopant concentration reaches this value is the interface between the n-type layer or the p-type layer and the i-type layer.

On the other hand, in the memory cell section 13, the word line WL, the bit line BL, the pin diode 22, the pillar 16 and the like are buried in a dielectric material 27. The dielectric material 27 is illustratively silicon oxide.

Next, the operation and effect of this embodiment are described.

In this embodiment, the lower portion of the pin diode 22W and the lower portion of the pin diode 22B extend in the word line direction and the bit line direction, respectively. Hence, as viewed vertically, the pin diodes 22W and 22B have a large area. This increases the forward current, and a large current flows from the bit line BL to the word line WL when the variable resistance film 24 is in the low-resistance state. This results in a large difference in the amount of current flowing in the low-resistance state of the variable resistance film 24 and the amount of current flowing in the high-resistance state thereof, widening the margin of read operation. This can prevent the malfunction of memory cells.

Furthermore, as described later in detail in second to fourth embodiments, in manufacturing the semiconductor memory device 1, each pillar 16 is formed by anisotropic etching such as RIE (reactive ion etching) from above. Here, the variable resistance film 24 illustratively made of a metal oxide is difficult to etch. Hence, the variable resistance film 24 is shaped like a taper with the lower surface being larger than the upper surface. Thus, the portion of the pillar 16 below the variable resistance film 24 is often laterally thicker than the portion of the pillar 16 above the variable resistance film 24. In this embodiment, the pin diode 22 is always located below the variable resistance film 24. Hence, as compared with the case where it is located above the variable resistance film 24, the area of the pin diode 22 as viewed vertically can be increased. This further increases the forward current and widens the margin of read operation.

Furthermore, processing the diode by RIE and the like damages the processed surface, that is, the side surface of the diode, by exposure to plasma and introduces defects therein. Electrons are trapped by these defects and act as fixed charges, which decrease the forward current. In this embodiment, the lower portion of the pin diode 22 is shaped like a line. Hence, as compared with the case where the diode is entirely shaped like a pillar, the side surface of the diode has a smaller area. This decreases the total amount of defects introduced into the diode, thereby decreasing the fixed charges and increasing the forward current.

Moreover, in this embodiment, there is no need to process the diode into a pillar to its lower end, which facilitates downscaling. Furthermore, this can reduce the time required to process the pillar.

In this embodiment, the upper portion of the diode is divided along both the word line direction and the bit line direction and shaped into pillars, whereas the lower portion of the diode is divided along only one direction of the word line direction and the bit line direction and shaped into a line. Here, the amount of digging for processing the diode into a pillar affects the position of the boundary between the upper portion shaped into a pillar and the lower portion shaped into a line, that is, the vertical position of the region B in the upper surface of the diode. The characteristics of the diode depend on this position of the region B.

As the position of the region B becomes higher, the aforementioned effect of increasing the forward current by increasing the area of the diode and the aforementioned effect of increasing the forward current by decreasing defects become greater. If the region B is located higher than the pn junction interface of the diode, the area of the pn junction interface increases, dispersing the reverse voltage. This increases the reverse breakdown voltage of the diode and widens the margin of program and erase operation.

However, if the region B is located higher than the pn junction interface of the diode, the leakage current along the extending direction of the diode increases, and malfunctions are more likely to occur. For example, if the region B of the pin diode 22B is located higher than the pn junction interface, the leakage current is likely to flow through the n-type layer 22$n$, which is the uppermost layer of the pin diode 22B, and short circuit is more likely to occur between the word lines WL connected to this pin diode 22B through the pillars 16. Here, unless the intermediate electrode film 23 on the pin diode 22B is divided into islands, the word lines WL are short-circuited almost definitely.

Conversely, if the region B is located lower, the aforementioned effect of increasing the forward current slightly decreases, and the effect of increasing the reverse breakdown voltage is not achieved. However, electrical isolation between the word lines WL and between the bit lines BL can be ensured.

Thus, in this embodiment, the vertical position of the region B is lower than the interface between the uppermost layer and the second uppermost layer of the plurality of layers constituting the pin diode, and higher than the position 35 nm below this interface. That is, for the pin diode 22W, the position of the region B is located in the range from 0 to 35 nm below the interface between the p-type layer 22p and the i-type layer 22i, and for the pin diode 22B, the position of the region B is located in the range from 0 to 35 nm below the interface between the n-type layer 22n and the i-type layer 22i. The reason for this is as follows. The processing variation in processing the pillar is approximately ±15 nm around the target position. In this context, if the vertical position of the region B is located in the aforementioned range, then, preferably, the region B can be reliably positioned lower than the pn junction interface, which can reliably prevent short circuit between the word lines WL and short circuit between the bit lines BL.

Next, a second embodiment of the invention is described.

This embodiment relates to a method for manufacturing a semiconductor memory device.

FIGS. 5 to 10 are process perspective views illustrating the method for manufacturing a semiconductor memory device according to this embodiment.

The configuration of the semiconductor memory device manufactured in this embodiment is generally the same as the configuration of the semiconductor memory device according to the above first embodiment.

Figure 5:
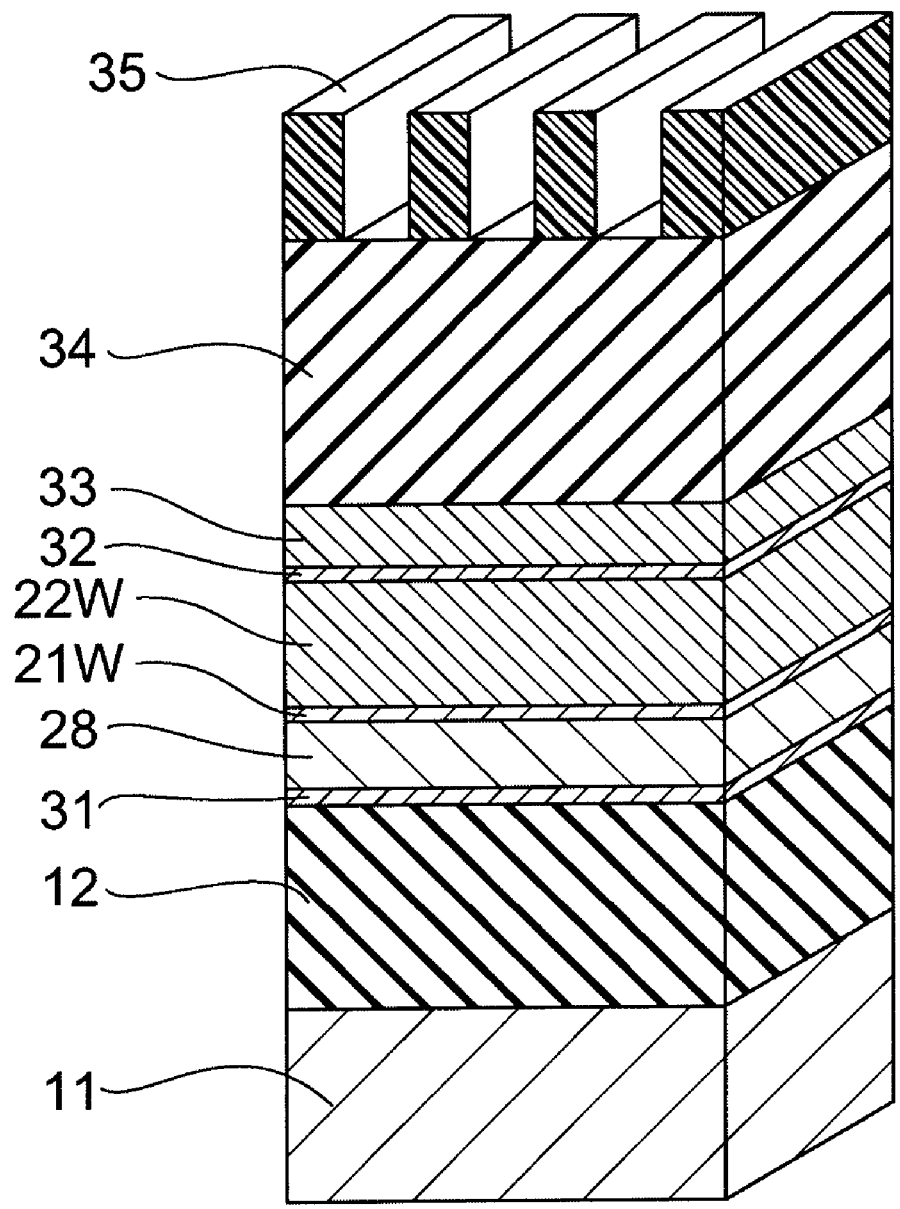
FIGS. 5 to 10 are process perspective views illustrating a method for manufacturing a semiconductor memory device according to a second embodiment of the invention.

First, as shown in FIG. 5, a driving circuit is formed in the upper surface of a silicon substrate 11. Next, an interlayer dielectric film 12 is formed on the silicon substrate 11 so as to bury the driving circuit. Next, a barrier metal 31 is formed on the interlayer dielectric film 12, and a conductive film 28 is formed thereon. The conductive film 28 is to be divided along the bit line direction into word lines WL in a later process. However, it is not yet divided at this point, but is a continuous film forming a plane parallel to both the bit line direction and the word line direction. Next, on the conductive film 28, a lower electrode film 21W, a pin diode 22W, an upper electrode film 32, and a stopper film 33 are formed in this order. In forming the pin diode 22W, an n-type layer 22n, an i-type layer 22i, and a p-type layer 22p (see FIGS. 2 and 3 for all of these layers) made of silicon are deposited in this order. The pin diode 22W is a diode for passing a current downward.

Next, a hard mask 34 illustratively made of silicon oxide is formed on the stopper film 33. Next, a resist film is formed and patterned by lithography into a resist pattern 35. In the region where a memory cell section 13 (see FIG. 1) is to be formed, the resist pattern 35 has a pattern configuration for word line processing, specifically a line-and-space configuration extending in the word line direction.

Next, the resist pattern 35 is used as a mask to perform RIE to selectively remove the hard mask 34. Thus, the pattern configuration of the resist pattern 35 is transferred to the hard mask 34.

Figure 6:
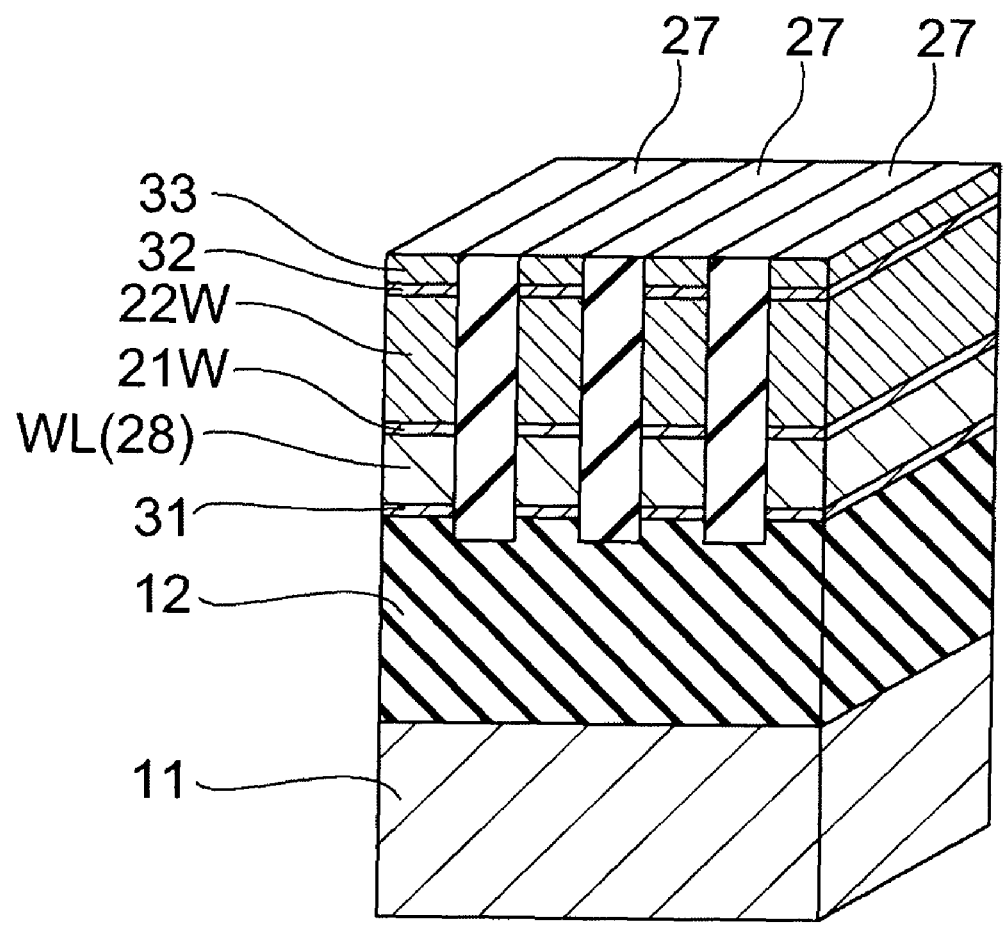
Figure 6:
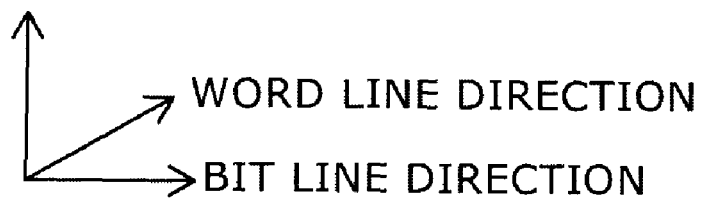

Next, as shown in FIG. 6, the patterned hard mask 34 (see FIG. 5) is used as a mask to perform RIE so that the stopper film 33, the upper electrode film 32, the pin diode 22W, the lower electrode film 21W, the conductive film 28, and the barrier metal 31 are etched in this order to the upper portion of the interlayer dielectric film 12. Thus, the stopper film 33, the upper electrode film 32, the pin diode 22W, the lower electrode film 21W, the conductive film 28, and the barrier metal 31 are divided along the bit line direction and processed into lines extending in the word line direction. At this time, the conductive film 28 is divided along the bit line direction into a plurality of word lines WL extending in the word line direction.

Next, a dielectric material 27 is buried in the portion removed by etching, and the upper surface is planarized by CMP (chemical mechanical polishing) using the stopper film 33 as a stopper. Thus, the hard mask 34 is removed, and the dielectric material 27 deposited on the stopper film 33 is removed to expose the stopper film 33.

Figure 7:
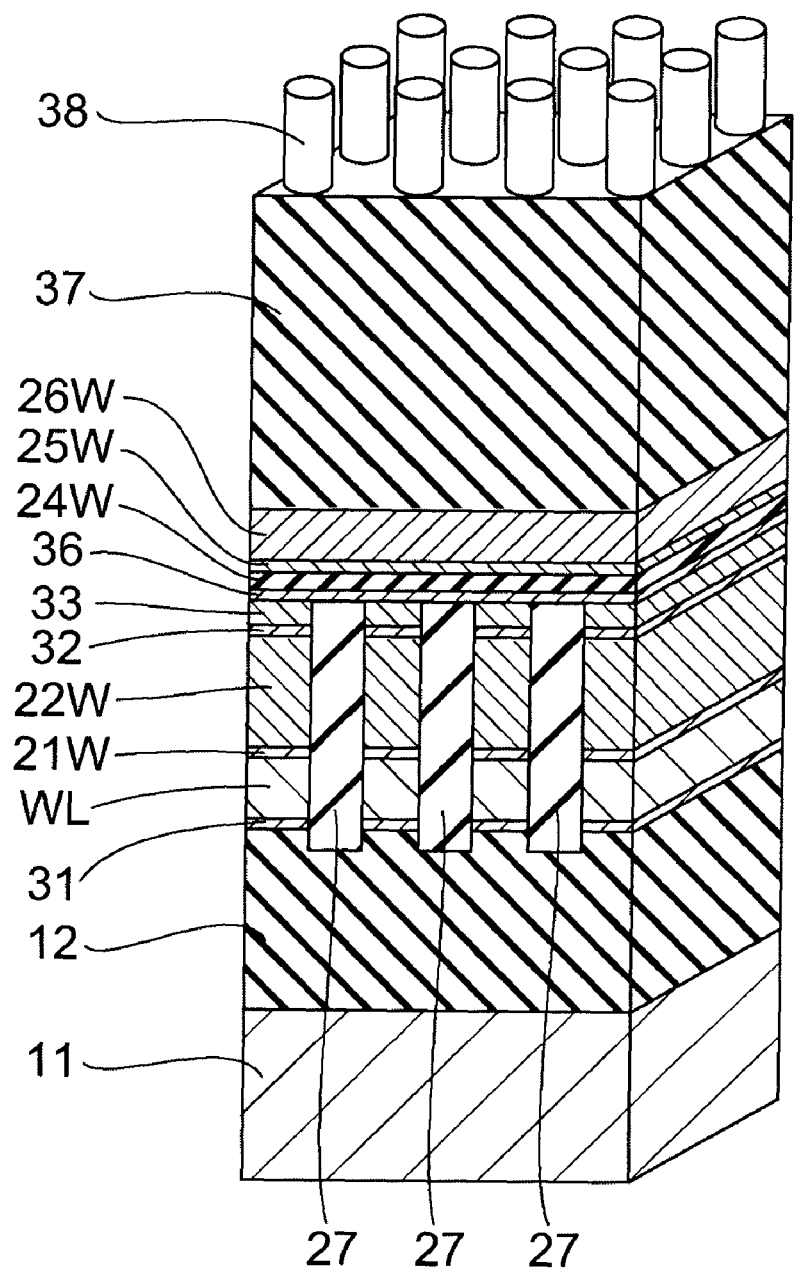
Figure 7:
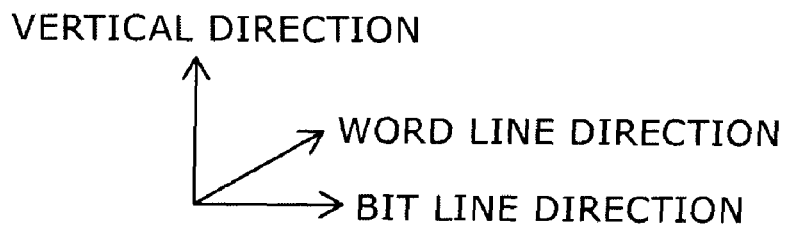

Next, as shown in FIG. 7, on the remaining stopper film 33, a lower electrode film 36, a variable resistance film 24W, an upper electrode film 25W, and a stopper film 26W are formed. Next, a hard mask 37 is deposited on the stopper film 26W, and a resist film is formed thereon and patterned by lithography. Thus, a resist pattern 38 is formed. In the region where the memory cell section 13 (see FIG. 1) is to be formed, the resist pattern 38 has a pattern configuration for pillar processing, specifically a pattern of a plurality of cylinders arranged in a matrix. Here, if the resist pattern 38 is shaped not like a cylinder but like a quadrangular prism, quadrangular prism pillars as in the above first embodiment are formed.

Next, as shown in FIG. 8, the pattern configuration of the resist pattern 38 (see FIG. 7) is transferred by RIE to the hard mask 37 (see FIG. 7). Then, the hard mask 37 is used as a mask to perform RIE so that the stopper film 26W, the upper electrode film 25W, the variable resistance film 24W, the lower electrode film 36, the stopper film 33, the upper electrode film 32, and the upper portion of the pin diode 22W are divided along both the word line direction and the bit line direction. The endpoint of this RIE is in the range from the upper surface of the pin diode 22W to the inside of the i-type layer 22i, illustratively in the range from the interface between the p-type layer 22p and the i-type layer 22i to the position 35 nm below this interface. Subsequently, the hard mask 37 is removed.

This results in pillars 16 including the upper portion of the pin diode 22W, the upper electrode film 32, the stopper film 33, the lower electrode film 36, the variable resistance film 24W, the upper electrode film 25W, and the stopper film 26W stacked in this order. As viewed vertically, the pillars 16 are arranged in a matrix and spaced from each other along the bit line direction and the word line direction. The multilayer film composed of the upper electrode film 32 above the diode, the stopper film 33, and the lower electrode film 36 below the variable resistance film corresponds to the intermediate electrode film 23W (see FIG. 2) in the above first embodiment. The variable resistance film 24W is tapered because it is difficult to process, and the portion of the pillar 16 below the variable resistance film 24W may be larger in diameter than the portion above the variable resistance film 24W.

Next, as shown in FIG. 9, a dielectric material 27 is buried in the portion removed by RIE, that is, between the pillars 16, and the upper surface is planarized by CMP.

Next, as shown in FIG. 10, on the pillars 16, a conductive film 29, a lower electrode film 21B, a pin diode 22B, an upper electrode film 39, and a stopper film 40 are formed in this order. The conductive film 29 is to be divided along the word line direction into bit lines BL in a later process. However, it is not yet divided at this point, but is a planar continuous film. In forming the pin diode 22B, a p-type layer 22p, an i-type layer 22*i*, and an n-type layer 22*n* made of silicon are deposited in this order. The pin diode 22B is a diode for passing a current upward.

Next, a hard mask (not shown) and a resist pattern (not shown) are formed on the stopper film 40. The resist pattern has a pattern configuration for bit line processing, specifically a line-and-space configuration extending in the bit line direction. The pattern configuration of the resist pattern is transferred to the hard mask. Then, by RIE, the stopper film 40, the upper electrode film 39, the pin diode 22B, the lower electrode film 21B, and the conductive film 29 are divided along the word line direction and processed into lines extending in the bit line direction. Thus, a plurality of bit lines BL extending in the bit line direction are formed from the conductive film 29. Subsequently, a dielectric material 27 is buried in the portion removed by RIE.

Next, a lower electrode film (not shown), a variable resistance film (not shown), an upper electrode film (not shown), and a stopper film (not shown) are formed. Then, as in the process shown in FIG. 8, a hard mask with a plurality of cylinders arranged in a matrix is formed, and used as a mask to perform RIE. The endpoint of this RIE is in the range from the upper surface to the i-type layer 22*i* of the pin diode 22B, illustratively in the range from the interface between the n-type layer 22*n* and the i-type layer 22*i* to the position 35 nm below this interface. Thus, the stopper film, the upper electrode film, the variable resistance film, the lower electrode film, the stopper film 40, the upper electrode film 39, and the upper portion of the pin diode 22B, such as the entirety of the n-type layer 22*n* and the upper portion of the i-type layer 22*i*, are divided along both the bit line direction and the word line direction.

Subsequently, the sequence of pillar formation, word line processing, pillar formation, and bit line processing is repeated likewise to form the memory cell section 13 (see FIG. 1). Here, the pillar formation is terminated in the upper portion of the diode. Thus, the semiconductor memory device is manufactured.

According to this embodiment, a semiconductor memory device having a similar configuration to that of the above first embodiment can be manufactured. Here, processing of the pillar 16 is terminated in the upper portion of the diode, leaving the lower portion of the diode in a line configuration. Hence, as compared with the case where the diode is entirely shaped like a pillar, processing is easier, and the processing cost is lower. Furthermore, the area of the processed surface of the diode is small. This decreases the total amount of defects introduced, and can ensure the forward current of the diode. The operation and effect of this embodiment other than the foregoing are the same as those of the above first embodiment.

Next, a third embodiment of the invention is described.

This embodiment relates to a method for manufacturing a semiconductor memory device.

FIGS. 11 to 16 are process perspective views illustrating the method for manufacturing a semiconductor memory device according to this embodiment.

This embodiment is different from the above second embodiment in that the diode formed is not a pin diode but a Schottky diode.

Figure 11:
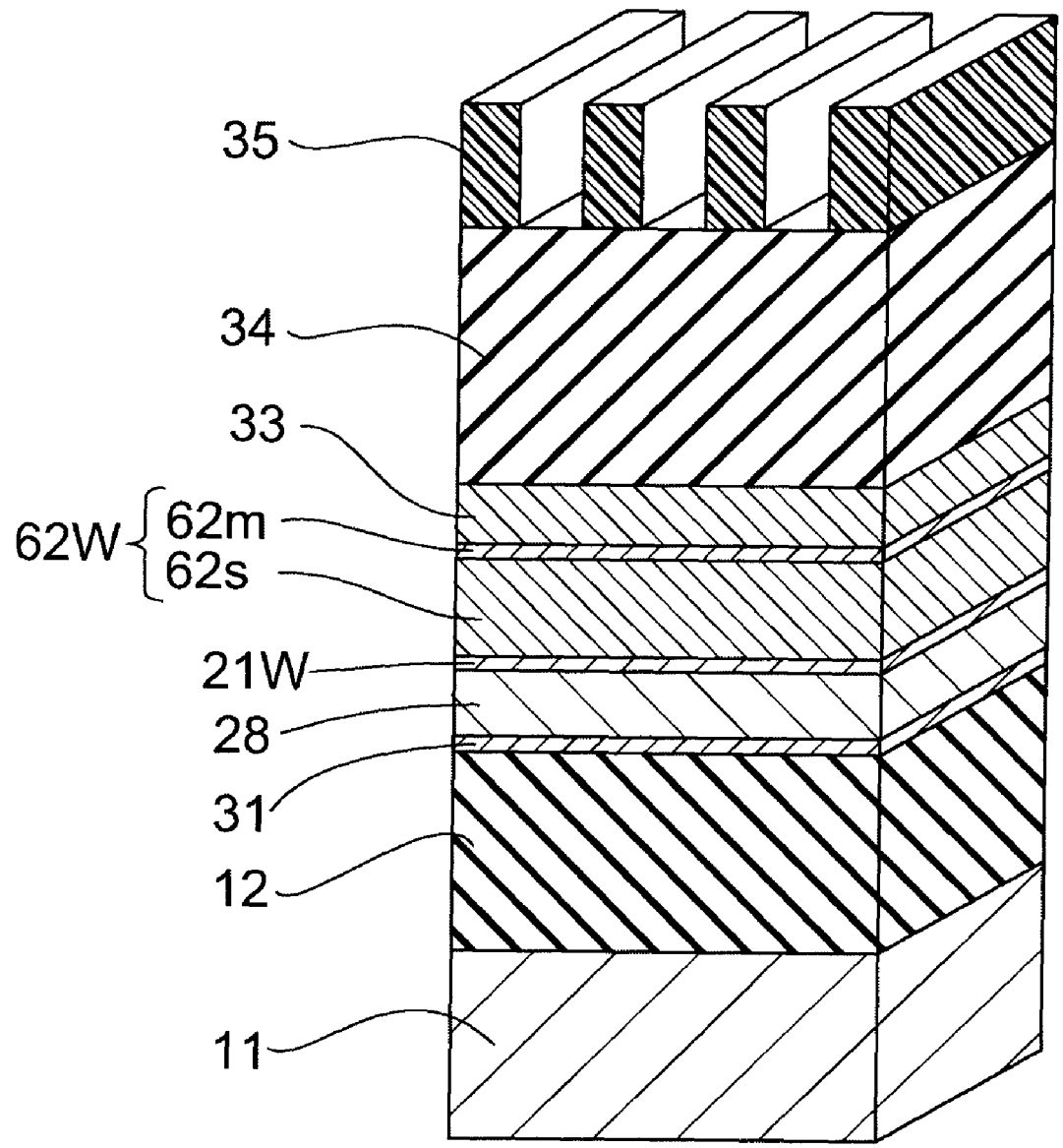
FIGS. 11 to 16 are process perspective views illustrating a method for manufacturing a semiconductor memory device according to a third embodiment of the invention.

First, as shown in FIG. 11, by a similar method to the above second embodiment, a driving circuit is formed in the upper surface of a silicon substrate 11, and an interlayer dielectric film 12 is formed so as to bury this driving circuit. Then, on the interlayer dielectric film 12, a barrier metal 31, a conductive film 28, and a lower electrode film 21W are formed in this order.

Next, on the lower electrode film 21W, a silicon layer 62*s* and a metal layer 62*m* are deposited in this order to form a Schottky diode 62W. Here, the Schottky diode 62W is formed as an n-type Schottky diode. It corresponds to a diode having conductivity types p-i-n from top and passing a current downward in terms of a normal silicon diode. Specifically, the silicon layer 62*s* is illustratively formed by depositing n-type polysilicon doped with donor impurity such as phosphorus (P) or arsenic (As). The metal layer 62*m* is illustratively formed from platinum (Pt), tantalum nitride (TaN), iridium (Ir), nickel (Ni), titanium nitride (TiN), or titanium silicide (TiSi$_2$).

Subsequently, a stopper film 33 is formed on the Schottky diode 62W. Then, by a similar method to the above second embodiment, a hard mask 34 and a resist pattern 35 are formed. The resist pattern 35 has a pattern configuration for word line processing, illustratively a line-and-space pattern extending in the word line direction.

Figure 12:
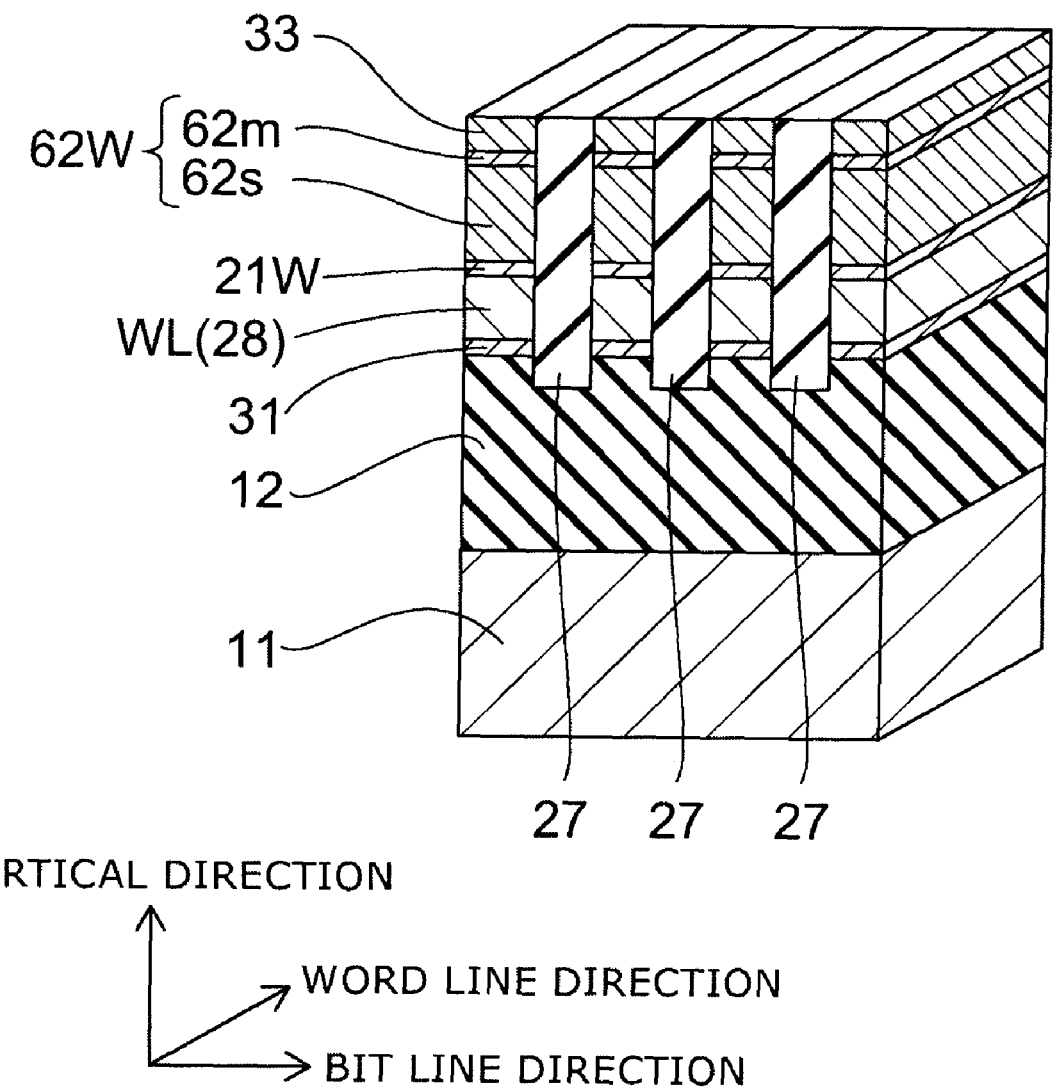

The subsequent processing is similar to the above second embodiment. More specifically, as shown in FIG. 12, the pattern configuration of the resist pattern 35 (see FIG. 11) is transferred to the hard mask 34 (see FIG. 11). Then, the hard mask 34 is used as a mask to perform RIE so that the stopper film 33, the metal layer 62*m*, the silicon layer 62*s*, the lower electrode film 21W, the conductive film 28, the barrier metal 31, and the upper portion of the interlayer dielectric film 12 are selectively removed. Thus, these films are divided along the bit line direction and processed into lines extending in the word line direction. At this time, a plurality of word lines WL are formed from the conductive film 28. Next, a dielectric material 27 is buried in the portion removed by etching, and the upper surface is planarized by CMP using the stopper film 33 as a stopper.

Figure 13:
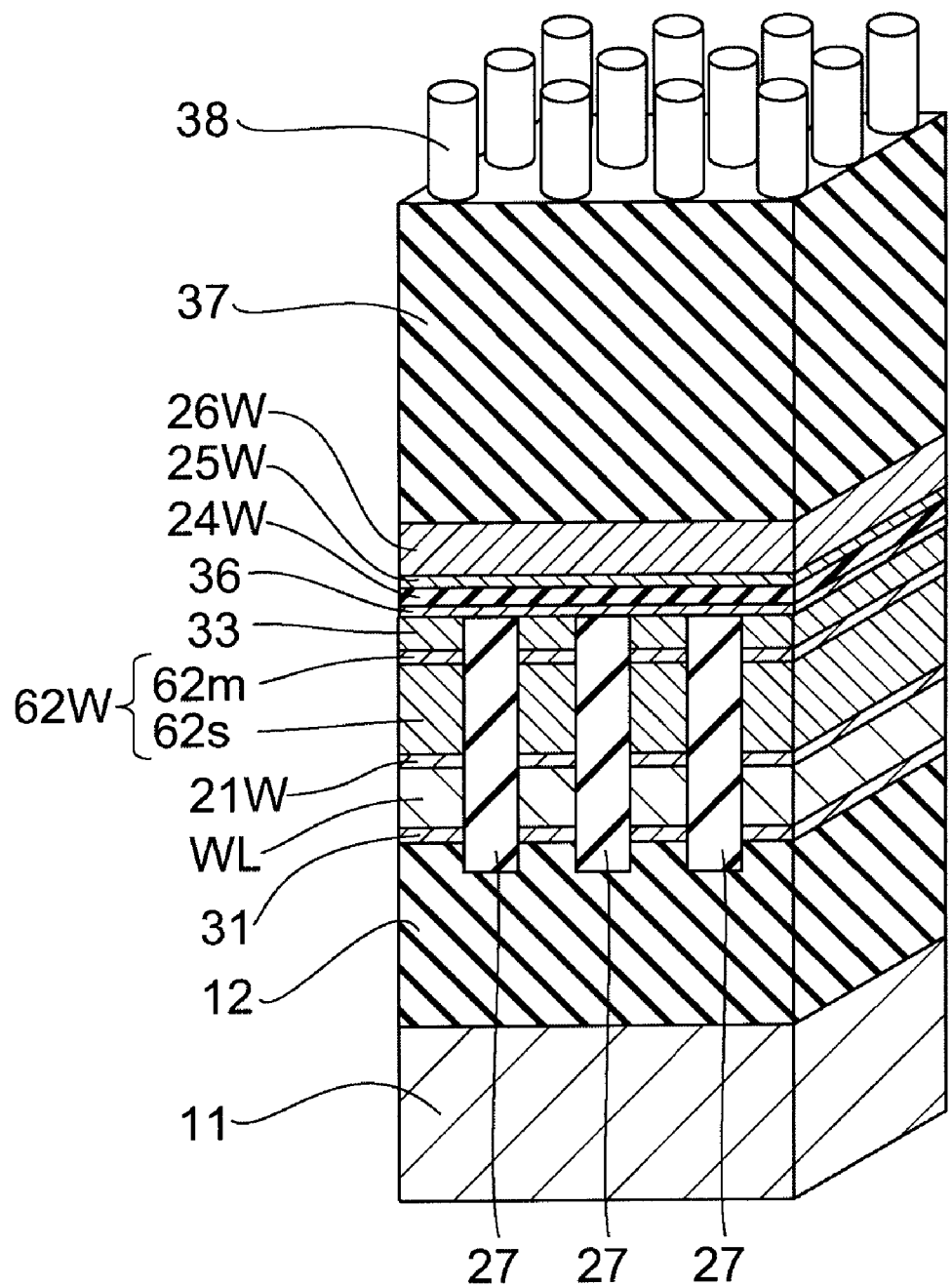

Next, as shown in FIG. 13, on the stopper film 33, a lower electrode film 36, a variable resistance film 24W, an upper electrode film 25W, and a stopper film 26W are formed in this order, and a hard mask 37 and a resist pattern 38 are formed thereon. The resist pattern 38 has a pattern configuration for pillar processing, illustratively a pattern of a plurality of cylinders arranged in a matrix.

Figure 14:
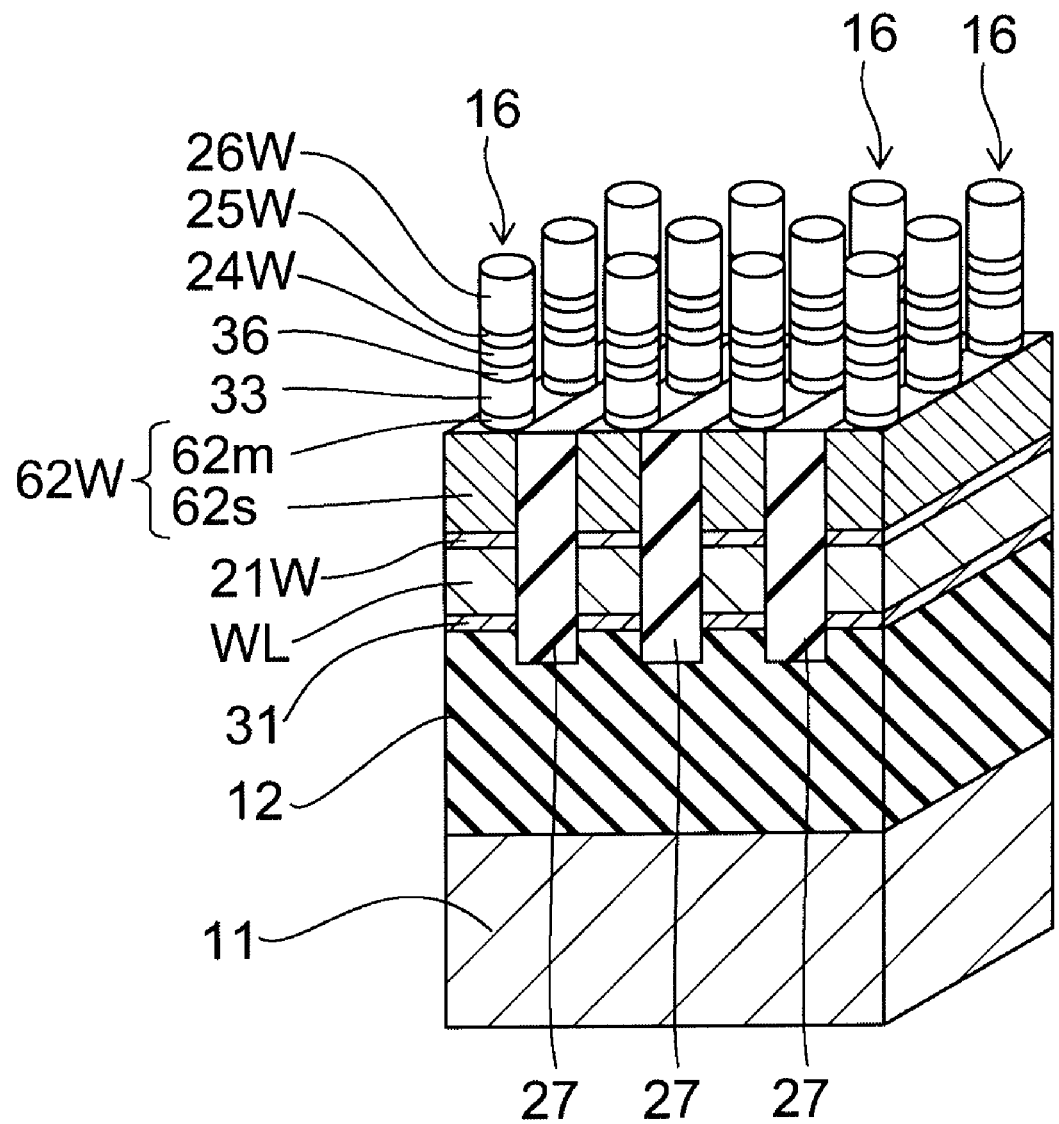

Next, as shown in FIG. 14, the pattern configuration of the resist pattern 38 (see FIG. 13) is transferred to the hard mask 37 (see FIG. 13), which is used as a mask to perform RIE to selectively remove the stopper film 26W, the upper electrode film 25W, the variable resistance film 24W, the lower electrode film 36, the stopper film 33, and the upper portion of the Schottky diode 62W. Thus, these films are divided along both the word line direction and the bit line direction and shaped into pillars. The endpoint of this RIE is located lower than the interface between the metal layer 62*m* and the silicon layer 62*s* of the Schottky diode 62W. Thus, the metal layer 62*m* can be reliably divided along both the word line direction and the bit line direction. For example, the endpoint of the RIE is located in the range from 0 to 35 nm below the interface between the metal layer 62*m* and the silicon layer 62*s*. Subsequently, the hard mask 37 is removed. Thus, pillars 16 are formed.

Figure 15:
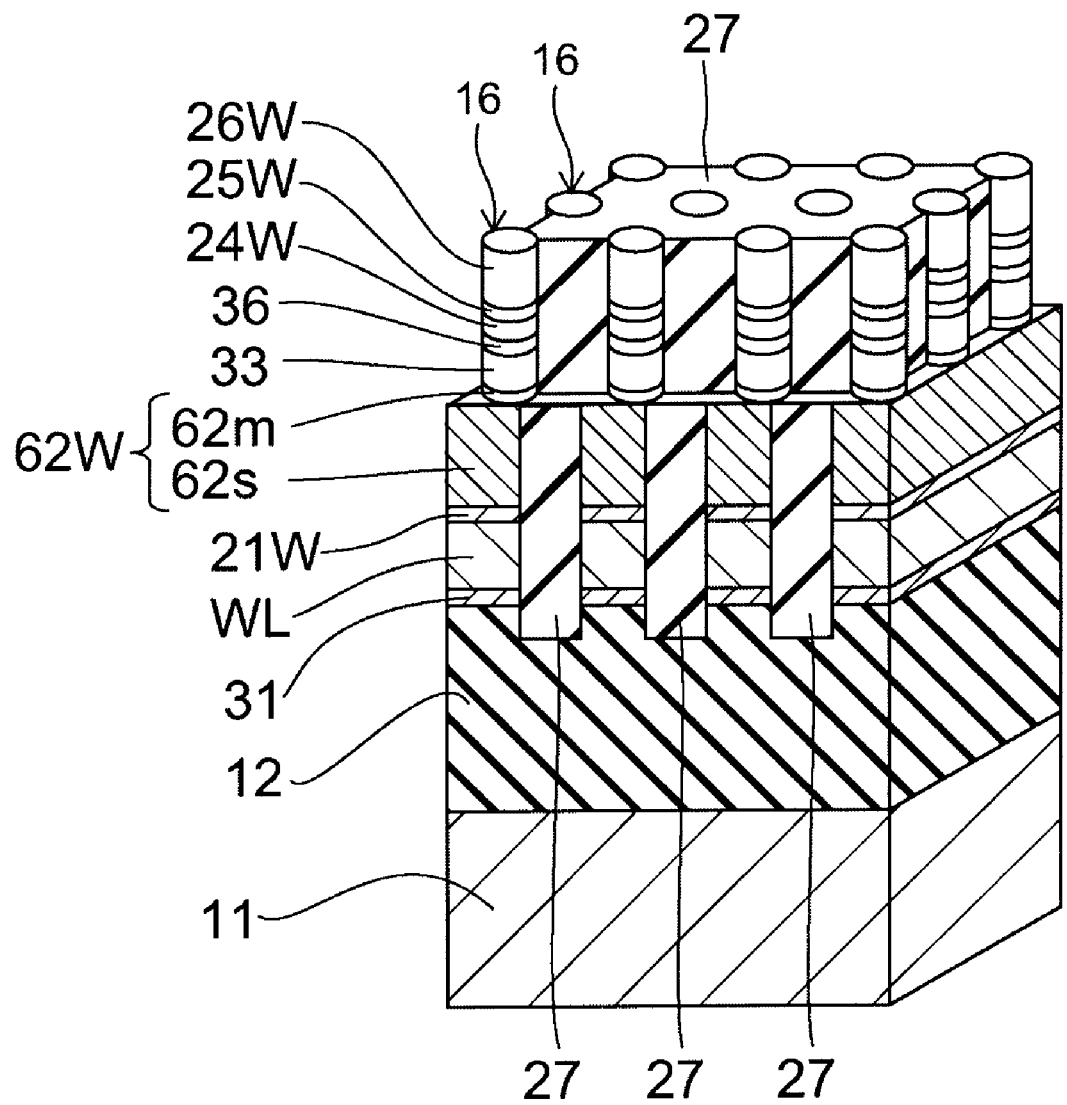
Figure 15:
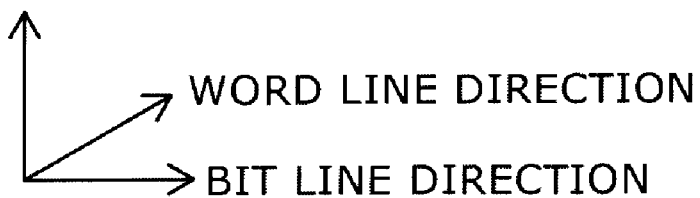

Next, as shown in FIG. 15, a dielectric material 27 is buried between the pillars 16, and the upper surface is planarized by CMP.

Figure 16:
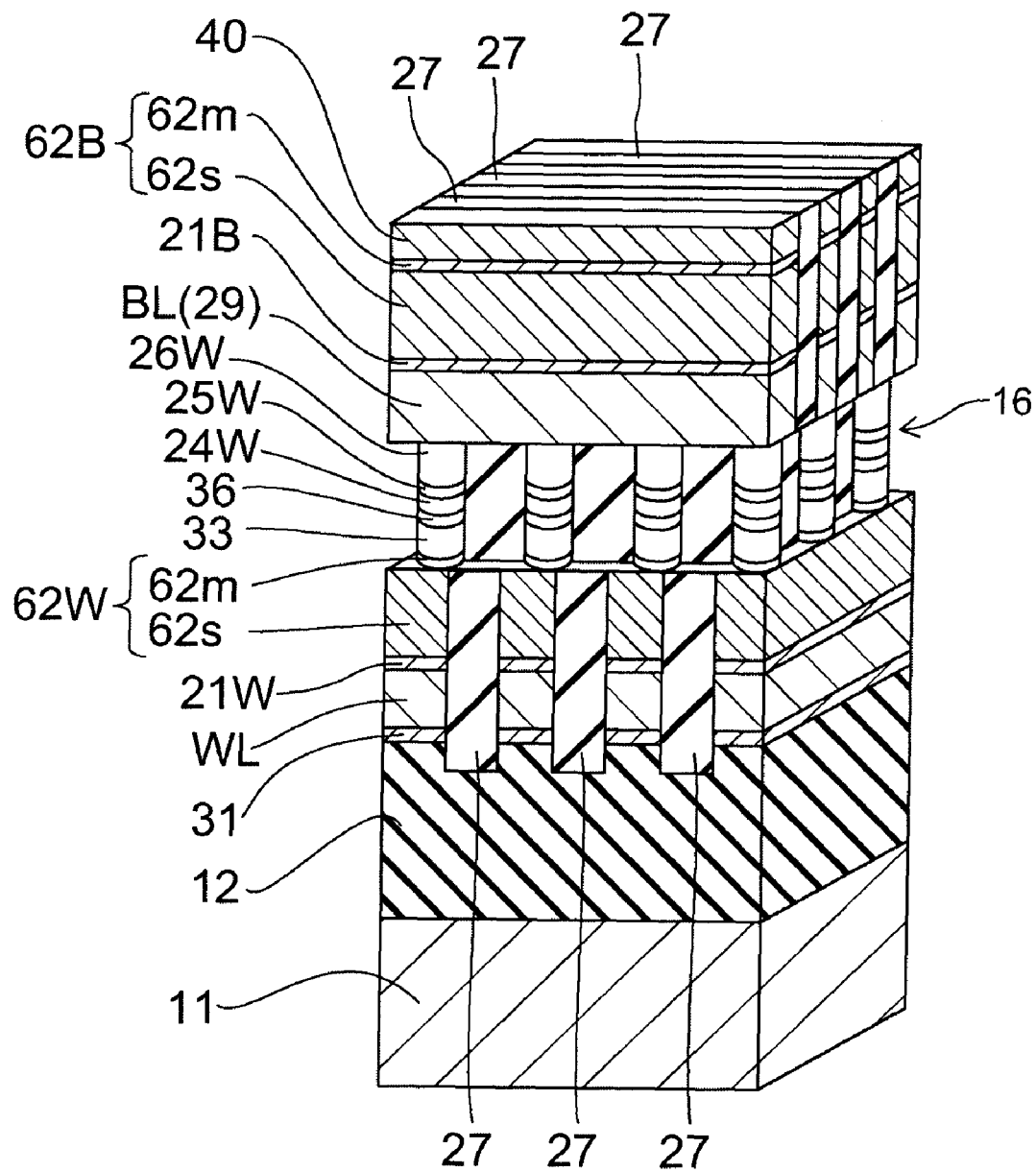

Next, as shown in FIG. 16, on the pillars 16, a conductive film 29, a lower electrode film 21B, a Schottky diode 62B, and a stopper film 40 are formed in this order. Here, the Schottky diode 62B is formed as a p-type Schottky diode by depositing a silicon layer 62*s* and a metal layer 62*m* in this order. It corresponds to a diode having conductivity types n-i-p from top and passing a current upward in terms of a normal silicon diode. Specifically, the silicon layer 62s is illustratively formed by depositing p-type polysilicon doped with acceptor impurity such as boron (B). The metal layer 62m is illustratively formed from hafnium (Hf), zirconium (Zr), aluminum (Al), or tantalum (Ta).

Next, a hard mask (not shown) is formed on the stopper film 40 and patterned into a pattern configuration for bit line processing. This is used as a mask to perform RIE so that the stopper film 40, the metal layer 62m, the silicon layer 62s, the lower electrode film 21B, and the conductive film 29 are divided along the word line direction and processed into lines extending in the bit line direction. Thus, a plurality of bit lines BL are formed from the conductive film 29. Subsequently, a dielectric material 27 is buried in the portion removed by RIE.

Next, as in the process shown in FIG. 13, on the stopper film 40, a lower electrode film (not shown), a variable resistance film (not shown), an upper electrode film (not shown), and a stopper film (not shown) are formed in this order. Then, a hard mask (not shown) with a plurality of cylinders arranged in a matrix is formed, and used as a mask to perform RIE. The endpoint of this RIE is located lower than the interface between the metal layer 62m and the silicon layer 62s of the Schottky diode 62B, illustratively in the range from 0 to 35 nm below this interface. Thus, the stopper film, the upper electrode film, the variable resistance film, the lower electrode film, the stopper film 40, and the metal layer 62m of the Schottky diode 62B are divided along both the bit line direction and the word line direction.

Subsequently, the sequence of pillar formation, word line processing, pillar formation, and bit line processing is repeated likewise to form a memory cell section. Here, the Schottky diode is formed so that the semiconductor layer is located on the lower side and the metal layer is located on the upper side, and the pillar formation is terminated inside the silicon layer of the Schottky diode. Thus, the semiconductor memory device according to this embodiment is manufactured. The condition for the aforementioned process other than the foregoing is the same as that of the above second embodiment.

According to this embodiment, a semiconductor memory device with the diode implemented as a Schottky diode can be manufactured. The operation and effect of this embodiment other than the foregoing are the same as those of the above first and second embodiments.

Next, a fourth embodiment of the invention is described.

This embodiment relates to a method for manufacturing a semiconductor memory device.

FIGS. 17 to 22 are process perspective views illustrating the method for manufacturing a semiconductor memory device according to this embodiment.

In this embodiment, like the above second embodiment, the diode is implemented as a pin diode. However, the processing method therefor is different from that of the above second embodiment.

Figure 17:
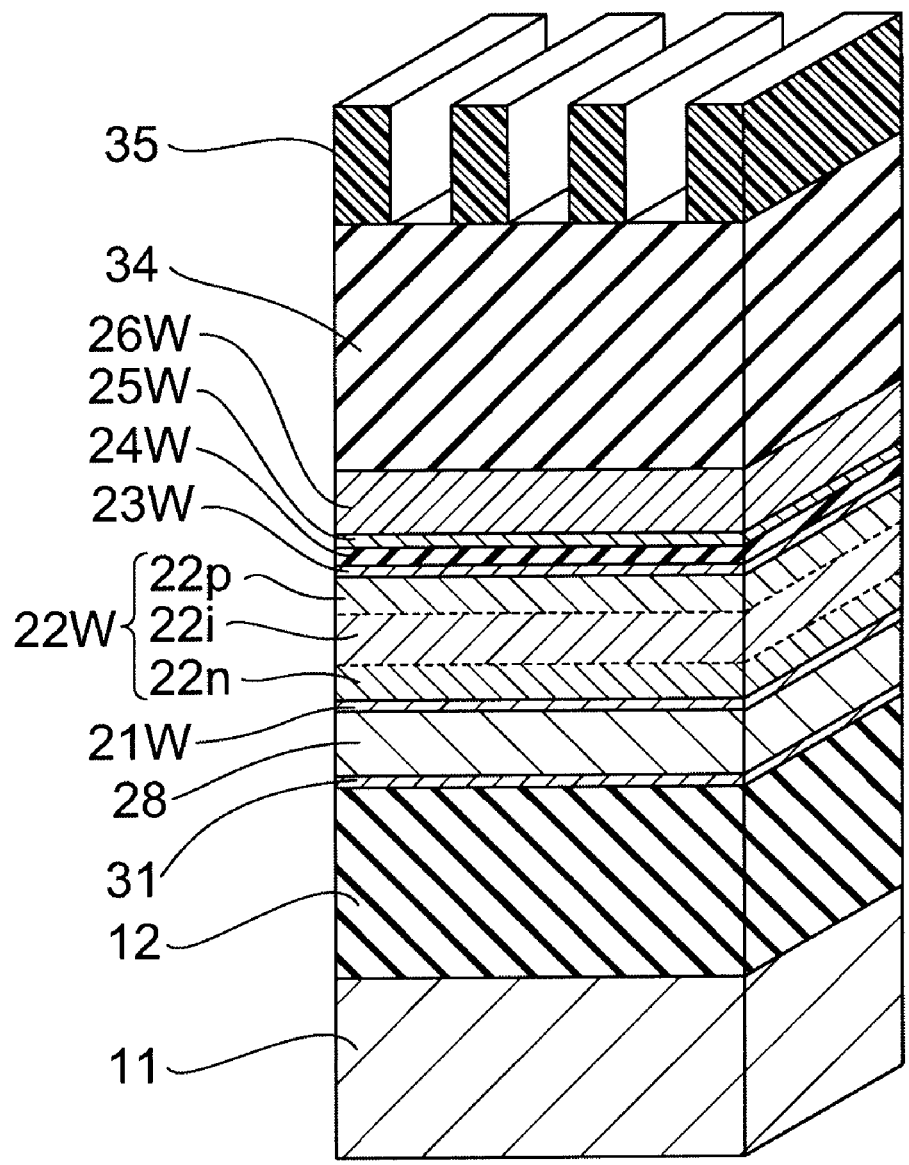
FIGS. 17 to 22 are process perspective views illustrating the method for manufacturing a semiconductor memory device according to a fourth embodiment of the invention.

First, as shown in FIG. 17, a driving circuit is formed in the upper surface of a silicon substrate 11, and an interlayer dielectric film 12 is formed on the silicon substrate 11 so as to bury this driving circuit. Next, on the interlayer dielectric film 12, a barrier metal 31, a conductive film 28, a lower electrode film 21W, a pin diode 22W, an intermediate electrode film 23W, a variable resistance film 24W, an upper electrode film 25W, and a stopper film 26W are formed in this order. In forming the pin diode 22W, an n-type layer 22n, an i-type layer 22i, and a p-type layer 22p made of silicon are deposited in this order. Each of these films is not yet divided at this point, but is a continuous film forming a plane parallel to both the bit line direction and the word line direction.

Subsequently, a hard mask 34 is formed on the stopper film 26W. Next, a resist film is formed and patterned by lithography into a resist pattern 35. In the region where a memory cell section 13 (see FIG. 1) is to be formed, the resist pattern 35 has a pattern configuration for word line processing, specifically a line-and-space configuration extending in the word line direction. Then, the resist pattern 35 is used as a mask to perform RIE to transfer the pattern configuration of the resist pattern 35 to the hard mask 34.

Figure 18:
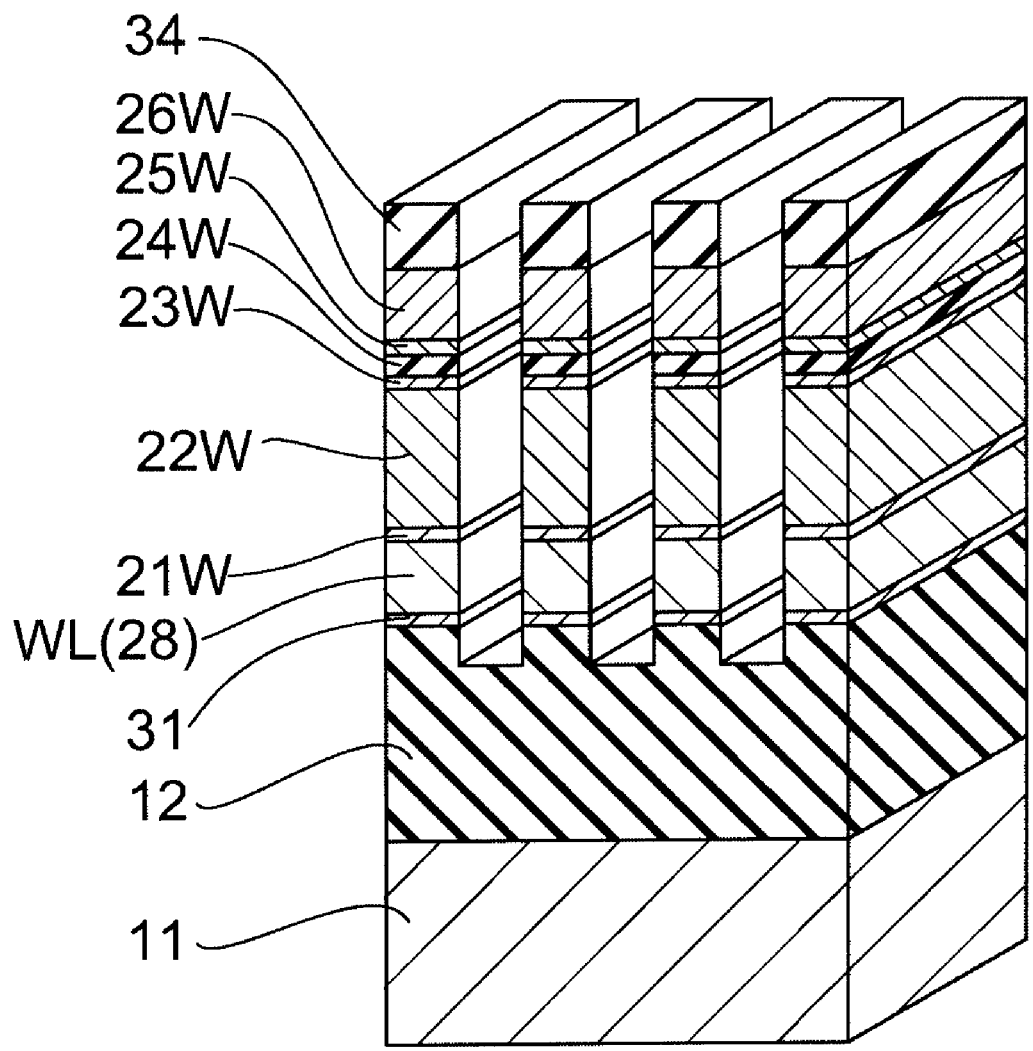
Figure 18:
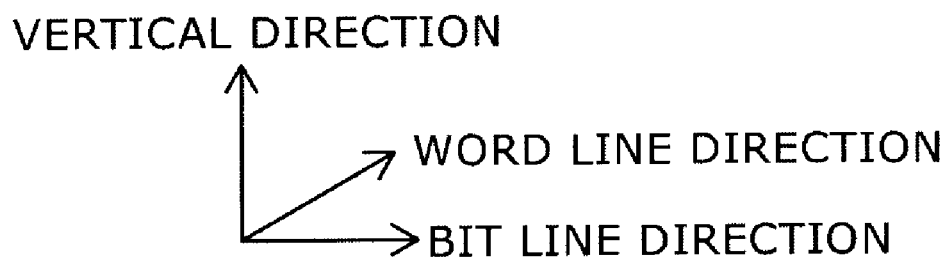

Next, as shown in FIG. 18, the patterned hard mask 34 is used as a mask to perform RIE so that the stopper film 26W, the upper electrode film 25W, the variable resistance film 24W, the intermediate electrode film 23W, the pin diode 22W, the lower electrode film 21W, the conductive film 28, and the barrier metal 31 are selectively removed, and the upper portion of the interlayer dielectric film 12 is also selectively removed. Thus, these films are divided along the bit line direction and processed into lines extending in the word line direction. Hence, a plurality of word lines WL are formed from the conductive film 28.

Figure 19:
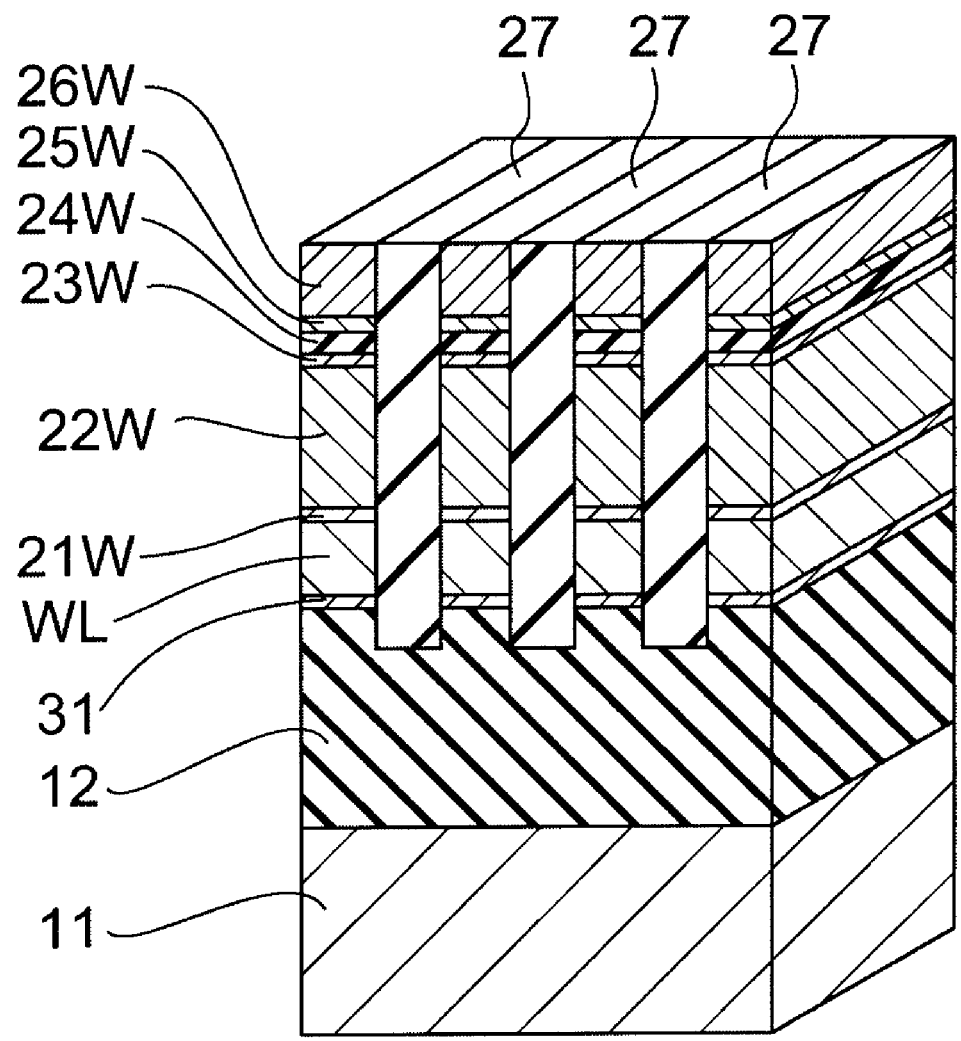
Figure 19:
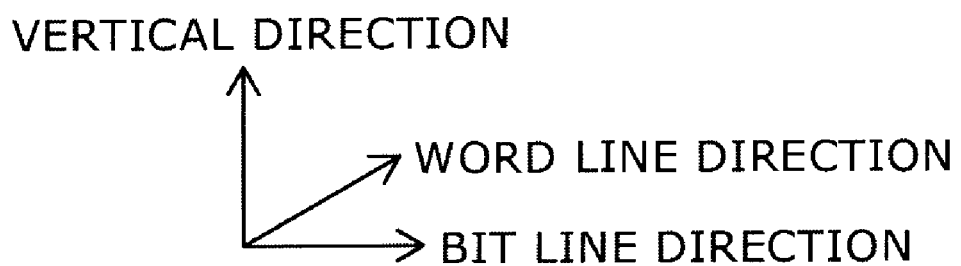

Next, as shown in FIG. 19, a dielectric material 27 is buried in the portion removed by etching, and the upper surface is planarized by CMP using the stopper film 26W as a stopper.

Figure 20:
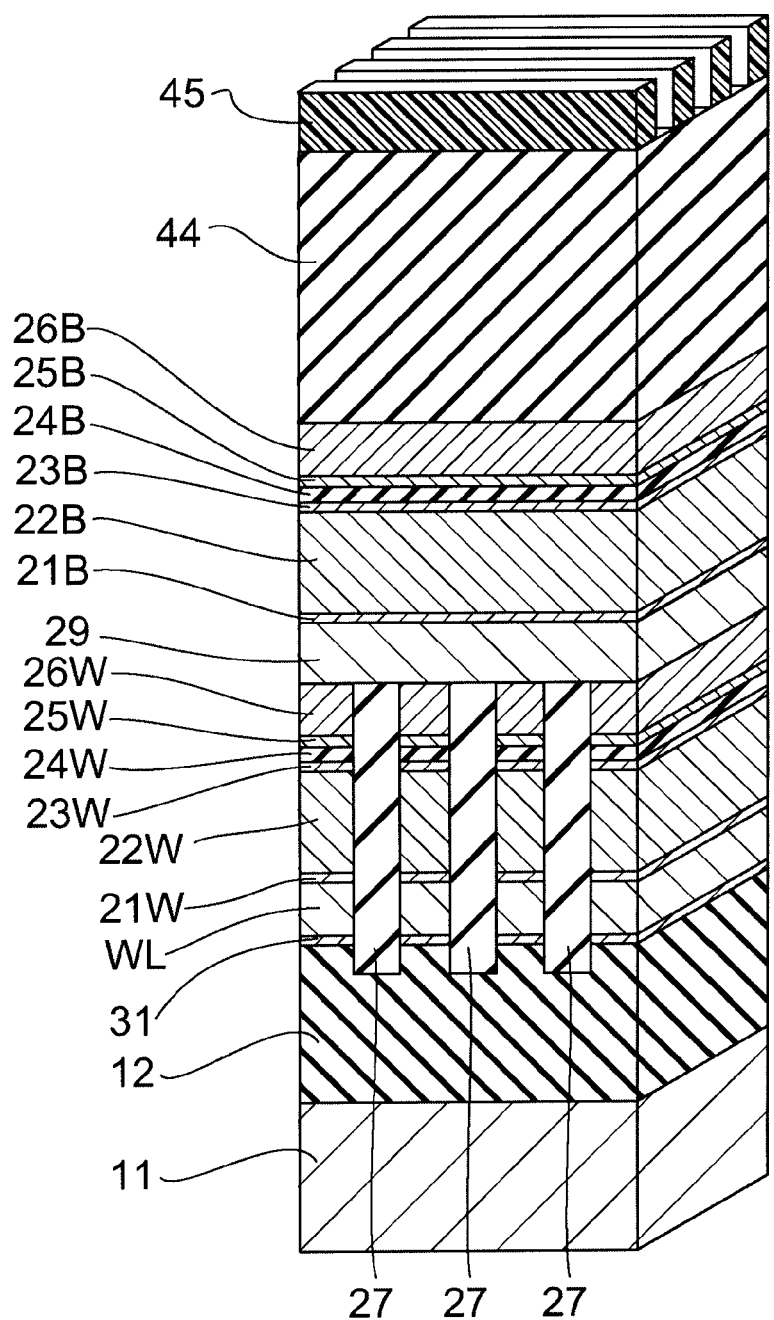

Next, as shown in FIG. 20, on the stopper film 26W, a conductive film 29, a lower electrode film 21B, a pin diode 22B, an intermediate electrode film 23B, a variable resistance film 24B, an upper electrode film 25B, and a stopper film 26B are formed in this order. Here, the pin diode 22B is formed by depositing a p-type layer 22p, an i-type layer 22i, and an n-type layer 22n in this order. Next, a hard mask 44 and a resist pattern 45 are formed on the stopper film 26B. The resist pattern 45 has a pattern configuration for bit line processing, specifically a line-and-space configuration extending in the bit line direction.

Figure 21:
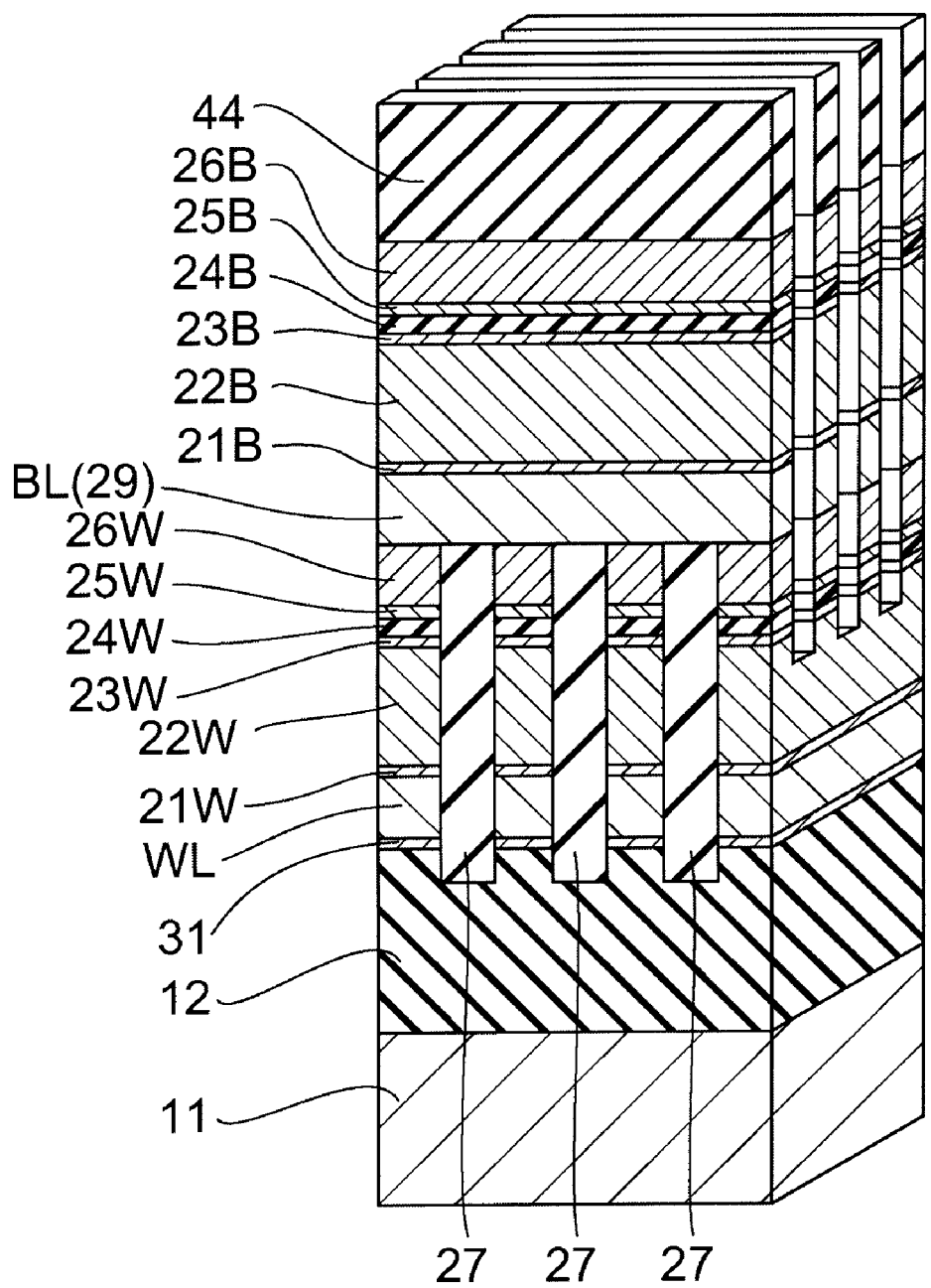
Figure 22:
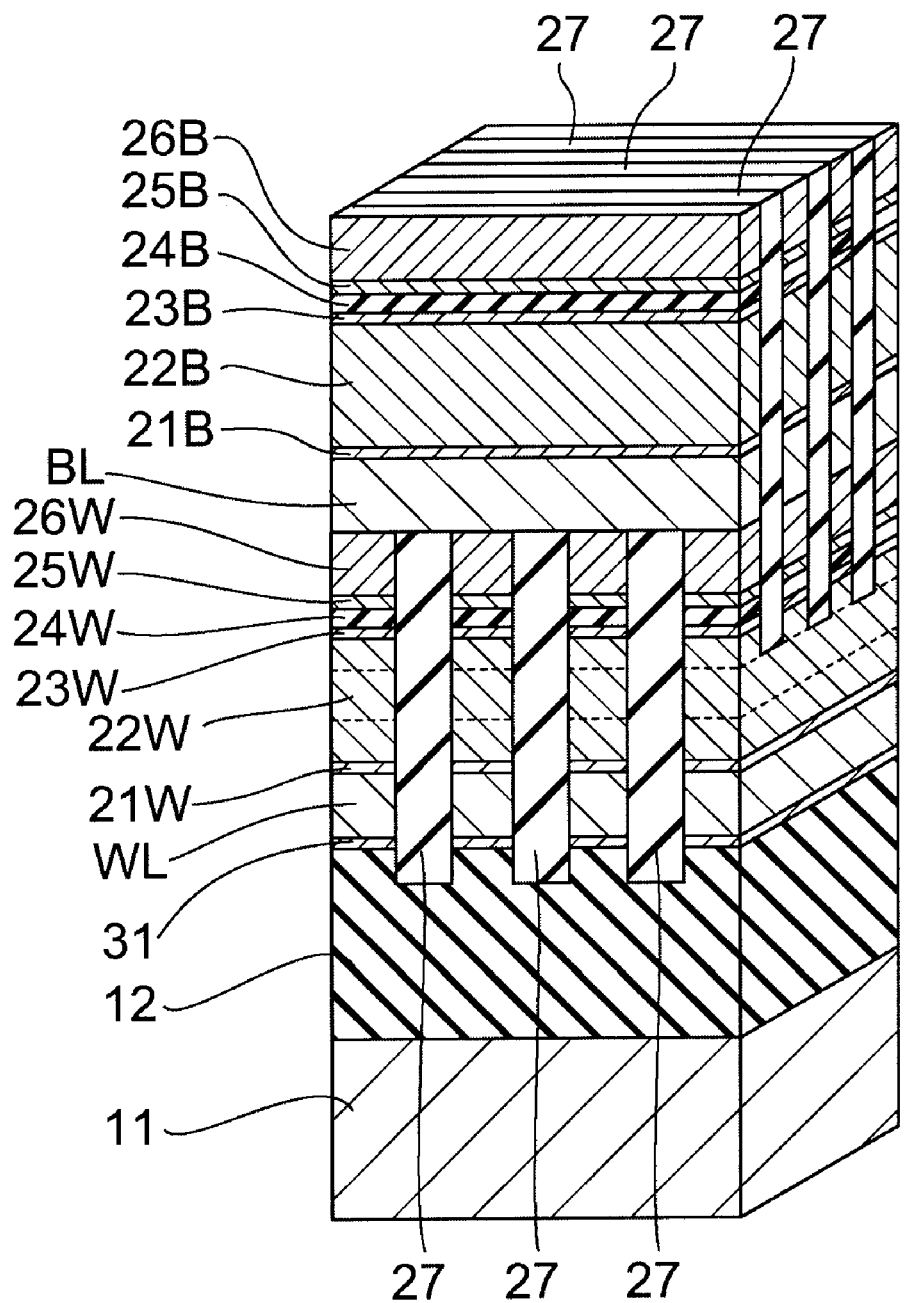
Figure 22:
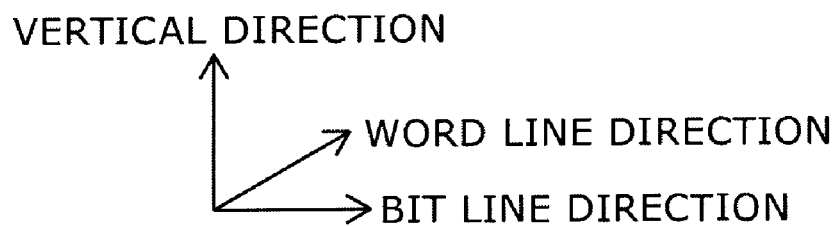

Next, as shown in FIG. 21, the pattern configuration of the resist pattern 45 is transferred to the hard mask 44, which is used as a mask to perform RIE to selectively remove the stopper film 26B, the upper electrode film 25B, the variable resistance film 24B, the intermediate electrode film 23B, the pin diode 22B, the lower electrode film 21B, the conductive film 29, the stopper film 26W, the upper electrode film 25W, the variable resistance film 24W, and the intermediate electrode film 23W, followed by selectively removing the upper portion of the pin diode 22W. The endpoint of this RIE is illustratively located in the range from 0 to 35 nm below the interface between the p-type layer 22p and the i-type layer 22i of the pin diode 22W. Subsequently, as shown in FIG. 22, a dielectric material 27 is buried in the portion removed by RIE, and the upper surface is planarized.

Thus, the portion extending from the stopper film 26B to the conductive film 29 (see FIG. 21) is divided along the word line direction and processed into lines extending in the bit line direction. At this time, the conductive film 29 is turned into a plurality of bit lines BL. The portion extending from the stopper film 26W to the intermediate electrode film 23W, which has already been divided along the bit line direction by RIE shown in FIG. 18, is divided also along the word line direction by the RIE at this time and consequently turned into quadrangular prism pillars extending vertically. Furthermore, the upper portion of the pin diode 22W is also processed into a pillar configuration. In contrast, the lower portion of the pin diode 22W remains in a line shape extending in the word line direction.

Next, by a process similar to that shown in FIG. 17, a conductive film 28, a pin diode 22W, a variable resistance film 24W and the like are stacked on the stopper film 26B and divided by RIE along the bit line direction. The endpoint of this RIE is located in the upper portion of the pin diode 22B. Thus, the variable resistance film 24W, the pin diode 22W, and the conductive film 28 are processed into lines extending in the word line direction. The variable resistance film 24B and the like stacked below the word line WL have already been processed, in the process shown in FIG. 21, into lines extending in the bit line direction. Hence, they are shaped into pillars in the present process.

Subsequently, likewise, a conductive film to serve as bit lines, a pin diode, a variable resistance film, a conductive film to serve as word lines, a pin diode, and a variable resistance film are successively deposited, whereas etching for dividing the workpiece along the bit line direction and etching for dividing the workpiece along the word line direction are performed so that the etching regions vertically overlap each other in the neighborhood of the variable resistance film. Hence, the bit lines and word lines are processed into a line configuration, and the variable resistance film is processed into a matrix configuration. Thus, the semiconductor memory device according to this embodiment is manufactured. The condition for the aforementioned process other than the foregoing is the same as that of the above second embodiment.

According to this embodiment, as compared with the above second embodiment, there is no need of lithography for forming pillars. Hence, the number of times of exposure can be reduced. Thus, the manufacturing cost of the semiconductor memory device can be reduced. The operation and effect of this embodiment other than the foregoing are the same as those of the above first and second embodiment.

In this embodiment, the diode is implemented as a pin diode. However, like the above third embodiment, a Schottky diode may be formed instead.

The invention has been described with reference to the embodiments. However, the invention is not limited to these embodiments. Those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A semiconductor memory device comprising:
a substrate;
a first interconnect layer having a plurality of first potential supply lines extending in a first direction;
a second interconnect layer having a plurality of second potential supply lines extending in a second direction crossing the first direction;
a variable resistance film located between the first potential supply line and the second potential supply line;
a diode located between the variable resistance film and one of the first potential supply line and the second potential supply line sandwiching the variable resistance film, the one potential supply line being located nearer to the substrate, the diode extending along the potential supply line located nearer to the substrate and passing a current in a direction from the first potential supply line to the second potential supply line; and
an upper electrode film located between the variable resistance film and one of the first potential supply line and the second potential supply line sandwiching the variable resistance film, the one potential supply line being located farther from the substrate, wherein:
the first interconnect layer and the second interconnect layer are alternately stacked on the substrate,
a region of an upper surface of the diode other than an immediately underlying region of the variable resistance film is located lower than the immediately underlying region, and
the diode is laterally thicker than the upper electrode film.

2. The device according to claim 1, wherein the diode is a pin diode.

3. The device according to claim 2, wherein the diode includes a p-type layer, an i-type layer, and an n-type layer located in this order from the first potential supply line side to the second potential supply line side.

4. The device according to claim 2, wherein the diode is formed from silicon.

5. A semiconductor memory device comprising:
a substrate;
a first interconnect layer having a plurality of first potential supply lines extending in a first direction;
a second interconnect layer having a plurality of second potential supply lines extending in a second direction crossing the first direction;
a variable resistance film located between the first potential supply line and the second potential supply line; and
a diode located between the variable resistance film and one of the first potential supply line and the second potential supply line sandwiching the variable resistance film, the one potential supply line being located nearer to the substrate, the diode extending along the potential supply line located nearer to the substrate and passing a current in a direction from the first potential supply line to the second potential supply line;
wherein:
the first interconnect layer and the second interconnect layer are alternately stacked on the substrate,
a region of an upper surface of the diode other than an immediately underlying region of the variable resistance film is located lower than the immediately underlying region, and
the diode is a Schottky diode with a metal layer located on its upper side and a semiconductor layer located on its lower side.

6. The device according to claim 5, wherein the metal layer is located nearer to the first potential supply line than the semiconductor layer, and formed from at least one metal selected from a group consisting of platinum, tantalum nitride, iridium, nickel, titanium nitride, and titanium silicide, and the semiconductor layer is formed from silicon having n-type conductivity.

7. The device according to claim 5, wherein the metal layer is located nearer to the second potential supply line than the semiconductor layer, and formed from at least one metal selected from a group consisting of hafnium, zirconium, aluminum, and tantalum, and the semiconductor layer is formed from silicon having p-type conductivity.

8. A semiconductor memory device comprising:
a substrate;
a first interconnect layer having a plurality of first potential supply lines extending in a first direction;
a second interconnect layer having a plurality of second potential supply lines extending in a second direction crossing the first direction;
a variable resistance film located between the first potential supply line and the second potential supply line; and
a diode located between the variable resistance film and one of the first potential supply line and the second potential supply line sandwiching the variable resistance film, the one potential supply line being located nearer to the substrate, the diode extending along the potential supply line located nearer to the substrate and passing a current in a direction from the first potential supply line to the second potential supply line;

wherein:

the first interconnect layer and the second interconnect layer are alternately stacked on the substrate, a region of an upper surface of the diode other than an immediately underlying region of the variable resistance film is located lower than the immediately underlying region, the diode includes a plurality of layers stacked vertically and having different electrical properties, a second uppermost layer of the plurality of layers has a thickness larger than 35 nm, and a vertical position of the region of the upper surface of the diode other than the immediately underlying region is located lower than an interface between an uppermost layer and the second uppermost layer of the plurality of layers, and higher than a position 35 nm below the interface.

9. The device according to claim 8, wherein the diode is a pin diode.

10. The device according to claim 9, wherein the uppermost layer is one of a p-type layer and an n-type layer, the second uppermost layer is an i-type layer, and the interface is located at a position having dopant concentration such that the number of dopants per memory cell is one on average.

11. The device according to claim 9, wherein the uppermost layer is one of a p-type layer and an n-type layer, the second uppermost layer is an i-type layer, and an average number of dopants in the i-type layer is less than one.

12. The device according to claim 8, wherein the diode is a Schottky diode with a metal layer located on its upper side and a semiconductor layer located on its lower side.

* * * * *